(12) United States Patent
Kwon et al.

(10) Patent No.: US 11,744,079 B2
(45) Date of Patent: Aug. 29, 2023

(54) SEMICONDUCTOR DEVICE, AN ELECTRONIC SYSTEM INCLUDING THE SAME, AND A METHOD OF MANUFACTURING THE SEMICONDUCTOR DEVICE

(71) Applicant: Samsung Electronics Co., Ltd., Suwon-si (KR)

(72) Inventors: Donghoon Kwon, Hwaseong-si (KR); Chang-Sun Hwang, Hwaseong-si (KR); Chungki Min, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 118 days.

(21) Appl. No.: 17/473,141

(22) Filed: Sep. 13, 2021

(65) Prior Publication Data
US 2022/0254802 A1 Aug. 11, 2022

(30) Foreign Application Priority Data
Feb. 9, 2021 (KR) .......... 10-2021-0018305

(51) Int. Cl.
*H01L 23/535* (2006.01)
*H10B 43/50* (2023.01)
(Continued)

(52) U.S. Cl.
CPC .......... *H10B 43/50* (2023.02); *H01L 23/535* (2013.01); *H01L 23/562* (2013.01); *H10B 41/27* (2023.02);
(Continued)

(58) Field of Classification Search
CPC ........ H10B 43/50; H10B 41/27; H10B 41/41; H10B 41/50; H10B 43/27; H10B 43/40;
(Continued)

(56) References Cited

U.S. PATENT DOCUMENTS 8,278,699 B2 10/2012 Tanaka et al.
9,524,975 B2 12/2016 Eom
(Continued)

FOREIGN PATENT DOCUMENTS

| CN | 108807405 A | 11/2018 |
|---|---|---|
| KR | 10-1995-0001926 A | 1/1995 |
| KR | 10-2021-0079087 A | 6/2021 |

*Primary Examiner* — Elias M Ullah
(74) *Attorney, Agent, or Firm* — Harness, Dickey & Pierce, P.L.C.

(57) ABSTRACT

A semiconductor device includes an upper-level layer having a cell array region, a cell contact region and a dummy region on a substrate. The upper-level layer includes a semiconductor layer, a cell array structure including first and second stack structures sequentially stacked on the semiconductor layer of the cell array region, the first and second stack structures comprising stacked electrodes, a first staircase structure on the semiconductor layer of the cell contact region, the electrodes extending from the cell array structure into the first staircase structure such that the cell array structure is connected to the first staircase structure, a vertical channel structure penetrating the cell array structure, a dummy structure in the dummy region, the dummy structure at the same level as the second stack structure, the dummy structure including stacked first layers, and cell contact plugs in the cell contact region and connected to the first staircase structure.

20 Claims, 28 Drawing Sheets

(51) Int. Cl.
  *H01L 23/00* (2006.01)
  *H10B 41/27* (2023.01)
  *H10B 41/41* (2023.01)
  *H10B 41/50* (2023.01)
  *H10B 43/27* (2023.01)
  *H10B 43/40* (2023.01)

(52) U.S. Cl.
  CPC ............ *H10B 41/41* (2023.02); *H10B 41/50* (2023.02); *H10B 43/27* (2023.02); *H10B 43/40* (2023.02)

(58) Field of Classification Search
  CPC ........ H10B 43/10; H10B 41/35; H10B 43/35; H01L 23/535; H01L 23/562; H01L 25/50; H01L 25/16; H01L 24/05; H01L 24/08; H01L 24/29; H01L 24/32; H01L 24/33; H01L 24/48; H01L 24/80; H01L 24/94; H01L 25/105; H01L 2224/04; H01L 2224/05647; H01L 2224/08145; H01L 2224/2919; H01L 2224/32145; H01L 2224/32225; H01L 2224/33181; H01L 2224/48091; H01L 2224/48227; H01L 2224/73251; H01L 2224/73265; H01L 2224/80895; H01L 2224/94; H01L 2225/06541; H01L 2225/06548; H01L 2225/1023; H01L 2924/15311; H01L 2924/181; H01L 2224/1023
  See application file for complete search history.

(56) References Cited

U.S. PATENT DOCUMENTS

| | | |
|---|---|---|
| 9,601,502 B2 | 3/2017 | Sano et al. |
| 9,673,213 B1 | 6/2017 | Yu et al. |
| 9,960,181 B1 | 5/2018 | Cui et al. |
| 10,269,620 B2 | 4/2019 | Yu et al. |
| 2019/0267323 A1 | 8/2019 | Smith et al. |
| 2020/0144281 A1 | 5/2020 | Baek et al. |
| 2020/0176033 A1 | 6/2020 | Hosotani et al. |
| 2020/0235123 A1 | 7/2020 | Sugiura et al. |
| 2021/0193672 A1 | 6/2021 | Kim et al. |

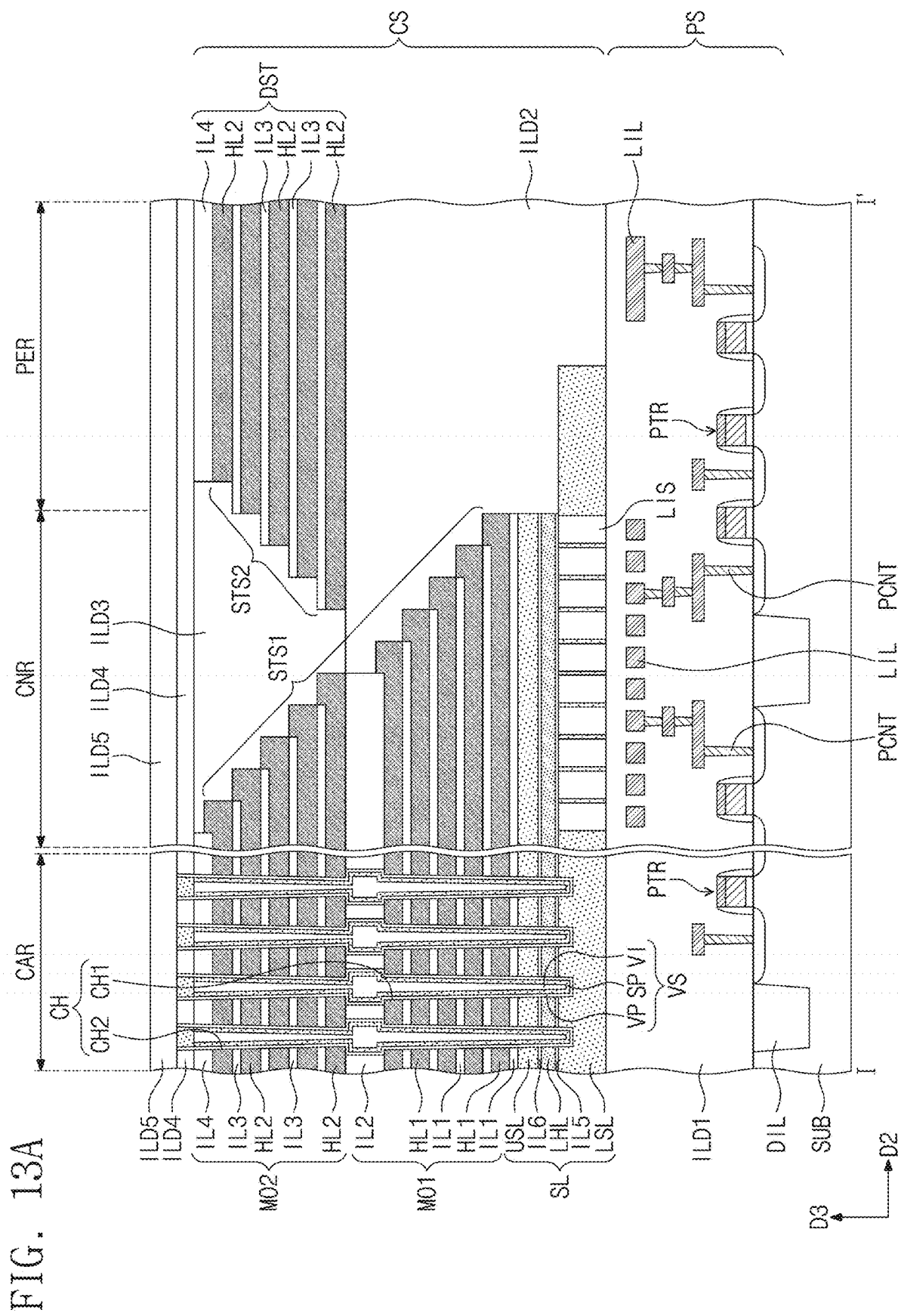

SEMICONDUCTOR DEVICE, AN ELECTRONIC SYSTEM INCLUDING THE SAME, AND A METHOD OF MANUFACTURING THE SEMICONDUCTOR DEVICE

CROSS-REFERENCE TO RELATED APPLICATION

This U.S. non-provisional patent application claims priority under 35 U.S.C. § 119 to Korean Patent Application No. 10-2021-0018305, filed on Feb. 9, 2021, in the Korean Intellectual Property Office, the disclosure of which is hereby incorporated by reference in its entirety.

BACKGROUND

Example embodiments of the inventive concepts relate to semiconductor devices (e.g., a three-dimensional (3D) semiconductor memory device), electronic systems including the same, and methods of manufacturing the semiconductor device.

An electronic system requiring data storage may benefit from a semiconductor device capable of storing high-capacity data. Thus, methods of increasing a data storage capacity of a semiconductor device have been studied. For example, a semiconductor device including three-dimensionally arranged memory cells instead of two-dimensionally arranged memory cells has been suggested as one of the methods of increasing the data storage capacity of the semiconductor device.

SUMMARY

Some example embodiments of the inventive concepts may provide semiconductor devices (e.g., a three-dimensional (3D) semiconductor memory device) capable of improving an integration density and reliability, and electronic systems including the same.

Some example embodiments of the inventive concepts may also provide a method of manufacturing semiconductor devices (e.g., a 3D semiconductor memory device) with improved integration density and reliability.

In some example embodiments, a semiconductor device may include an upper-level layer on a substrate. The upper-level layer may have a cell array region, a dummy region, and a cell contact region between the cell array region and the dummy region. The upper-level layer may include: a semiconductor layer; a cell array structure on the semiconductor layer of the cell array region, the cell array structure including a first stack structure on the semiconductor layer and a second stack structure on the first stack structure, wherein each of the first and second stack structures includes a plurality of electrodes stacked and spaced apart from each other; a first staircase structure on the semiconductor layer of the cell contact region, the plurality of electrodes extending from the cell array structure into the first staircase structure such that the cell array structure and the first staircase structure are connected to each other; a vertical channel structure penetrating the cell array structure so as to be connected to the semiconductor layer; a dummy structure in the dummy region, the dummy structure at the same level as the second stack structure, and the dummy structure including a plurality of first layers stacked and spaced apart from each other; and cell contact plugs in the cell contact region and connected to the first staircase structure. The cell contact region may include an overlapping region adjacent to the dummy region, and the dummy structure may vertically overlap with at least a portion of the first staircase structure in the overlapping region.

In some example embodiments, a semiconductor device may include an upper-level layer on a substrate. The upper-level layer may have a cell array region, a dummy region, and a cell contact region between the cell array region and the dummy region. The upper-level layer may include: a semiconductor layer; a cell array structure on the semiconductor layer of the cell array region, the cell array structure including a first stack structure on the semiconductor layer and a second stack structure on the first stack structure, wherein each of the first and second stack structures includes a plurality of electrodes stacked and spaced apart from each other; a staircase structure on the semiconductor layer of the cell contact region, the plurality of electrodes extending from the cell array structure into the staircase structure such that the cell array structure and the staircase structure are connected to each other; a vertical channel structure penetrating the cell array structure so as to be connected to the semiconductor layer; a dummy structure in the dummy region, the dummy structure at the same level as the second stack structure, and the dummy structure including a plurality of first layers stacked and spaced apart from each other; and cell contact plugs in the cell contact region and connected to the staircase structure. The cell contact region may include an overlapping region adjacent to the dummy region. The cell contact plugs may include a first cell contact plug in the overlapping region, and the first cell contact plug may penetrate the dummy structure so as to be connected to the staircase structure.

In some example embodiments, an electronic system may include a semiconductor device including an input/output pad electrically connected to peripheral circuits, and a controller electrically connected to the semiconductor device through the input/output pad and configured to control the semiconductor device. The semiconductor device may include a lower-level layer including the peripheral circuits on a substrate, and an upper-level layer on the lower-level layer. The upper-level layer may have a cell array region, a dummy region, and a cell contact region between the cell array region and the dummy region. The upper-level layer may include: a semiconductor layer; a cell array structure on the semiconductor layer of the cell array region, the cell array structure including a first stack structure on the semiconductor layer and a second stack structure on the first stack structure, wherein each of the first and second stack structures includes a plurality of electrodes stacked and spaced apart from each other; a vertical channel structure penetrating the cell array structure so as to be connected to the semiconductor layer; a first staircase structure on the semiconductor layer of the cell contact region, the plurality of electrodes extending from the cell array structure into the first staircase structure such that the cell array structure and the first staircase structure are connected to each other; a dummy structure in the dummy region, the dummy structure at the same level as the second stack structure, the dummy structure including a plurality of first layers stacked and spaced apart from each other, and the dummy structure including a second staircase structure extending from the dummy region into the cell contact region; and cell contact plugs in the cell contact region and connected to the first staircase structure. The cell contact region may include an overlapping region adjacent to the dummy region, and the second staircase structure of the dummy structure may vertically overlap with at least a portion of the first staircase structure in the overlapping region.

In some example embodiments, a method of manufacturing a semiconductor device may include: forming a lower-level layer on a substrate, the lower-level layer including a peripheral transistor and a lower interconnection line on the peripheral transistor; forming a semiconductor layer on the lower-level layer; alternately stacking first insulating layers and first sacrificial layers on the semiconductor layer to form a first mold structure; alternately stacking second insulating layers and second sacrificial layers on the first mold structure to form a second mold structure in a cell array region and a dummy structure in a dummy region, the dummy structure vertically overlapping with at least a portion of the first mold structure in an overlapping region between the cell array region and the dummy region; forming a vertical channel structure which penetrates the first and second mold structures to extend to the semiconductor layer; forming a cell contact hole which penetrates the dummy structure, the first mold structure and the semiconductor layer in the overlapping region to expose the lower interconnection line; replacing a portion of each of the second sacrificial layers of the dummy structure, which is exposed by the cell contact hole, with a sidewall insulator; replacing the first sacrificial layers of the first mold structure and the second sacrificial layers of the second mold structure with electrodes; and forming a cell contact plug in the cell contact hole.

BRIEF DESCRIPTION OF THE DRAWINGS

The inventive concepts will become more apparent in view of the attached drawings and accompanying detailed description.

FIGS. 7A, 8A, 9A, 10A, 11A, 12A, 13A, 14A and 15A are cross-sectional views taken along the line I-I' of FIG. 5 to illustrate a method of manufacturing a semiconductor device according to some example embodiments of the inventive concepts.

DETAILED DESCRIPTION

Figure 1:
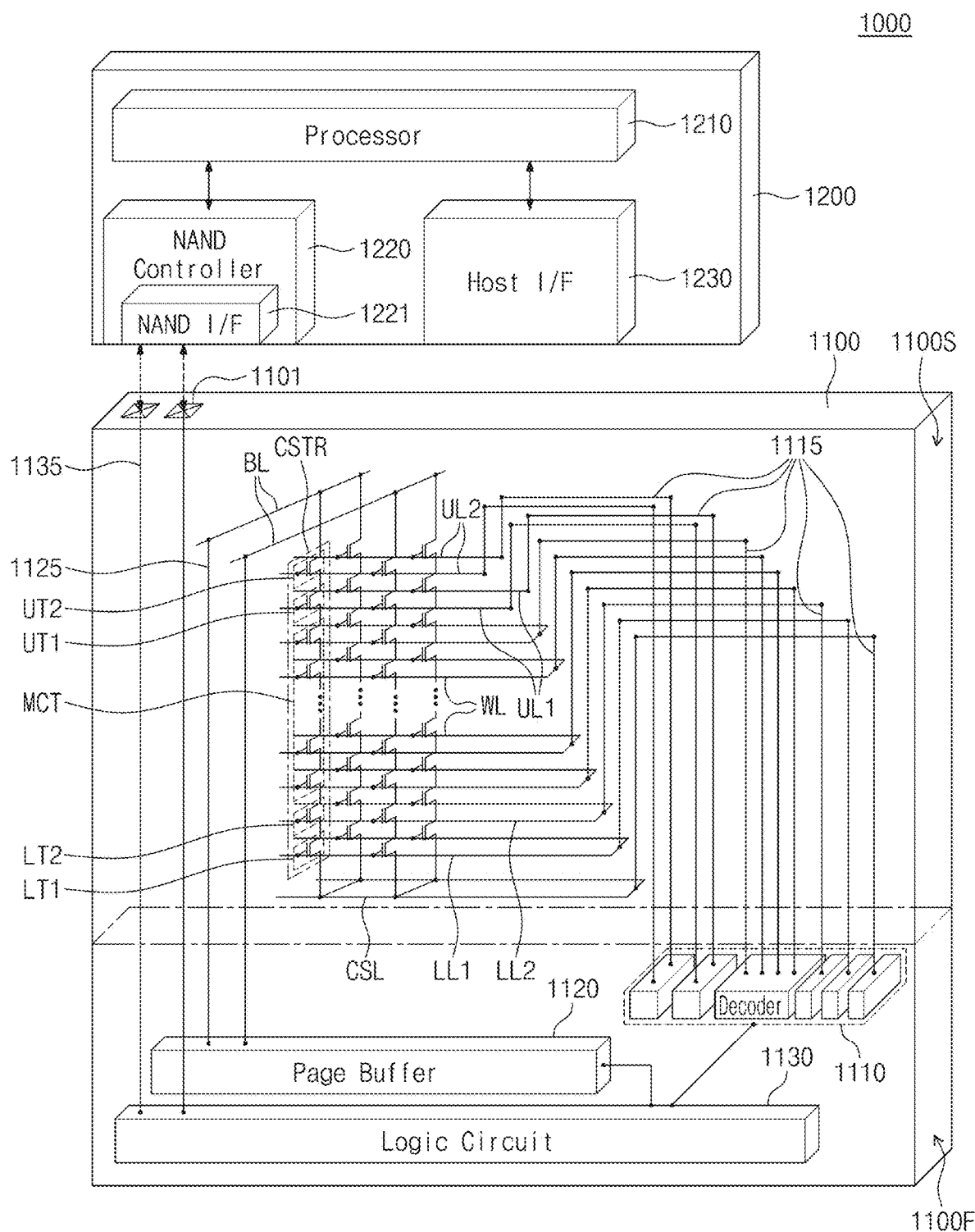
FIG. 1 is a schematic view illustrating an electronic system including a semiconductor device according to some example embodiments of the inventive concepts.

FIG. 1 is a schematic view illustrating an electronic system including a semiconductor device according to some example embodiments of the inventive concepts.

Referring to FIG. 1, an electronic system 1000 according to some example embodiments of the inventive concepts may include a semiconductor device 1100 and a controller 1200 electrically connected to the semiconductor device 1100. The electronic system 1000 may be a storage device including one or more semiconductor devices 1100, or an electronic device including the storage device. For example, the electronic system 1000 may be a solid-state drive (SSD) device, a universal serial bus (USB) device, a computing system, a medical device or a communication device, which includes the one or more semiconductor devices 1100.

The semiconductor device 1100 may be a non-volatile memory device, for example, a NAND flash memory device. The semiconductor device 1100 may include a first structure 1100F and a second structure 1100S on the first structure 1100F. In some example embodiments, the first structure 1100F may be disposed (e.g., located) at a side of the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the common source line CSL and the bit lines BL.

It will be understood that an element that is described herein to be "on" another element may be directly on the other element or indirectly on the other element. An element that is directly on another element will be understood to be in direct contact with the other element. An element that is indirectly on another element will be understood to be isolated from direct contact with the other element by one or more interposing spaces and/or structures. Additionally, it will be understood that an element that is described herein to be "on" another element may be "above" or "beneath" the other element.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed.

In some example embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, respectively, and the gate upper lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2, which are connected in series to each other. The upper transistors UT1 and UT2 may include a string selection transistor UT1 and an upper erase control transistor UT2, which are connected in series to each other. At least one of the lower erase control transistor LT1 or the upper erase control transistor UT2 may be used in an erase operation of erasing data stored in the memory cell transistors MCT by using a gate induced drain leakage (GIDL) phenomenon.

The common source line CSL, the first and second gate lower lines LL1 and LL2, the word lines WL and the first and second gate upper lines UL1 and UL2 may be electrically connected to the decoder circuit 1110 through first connection lines 1115 extending from the inside of the first structure 1100F into the second structure 1100S. The bit lines BL may be electrically connected to the page buffer 1120 through second connection lines 1125 extending from the inside of the first structure 1100F into the second structure 1100S.

In the first structure 1100F, the decoder circuit 1110 and the page buffer 1120 may perform a control operation on at least one selected from the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending from the inside of the first structure 1100F into the second structure 1100S.

The controller 1200 may include a processor 1210, a NAND controller 1220, and a host interface 1230. The electronic system 1000 may include a plurality of the semiconductor devices 1100 in some example embodiments, and in this case, the controller 1200 may control the plurality of semiconductor devices 1100.

The controller 1200 (or other circuitry, for example the processor 1210, the NAND controller 1220, and the host interface 1230, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The processor 1210 may control overall operations of the electronic system 1000 including the controller 1200. The processor 1210 may operate according to predetermined firmware and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the electronic system 1000 and an external host. When a control command is received from the external host through the host interface 1230, the processor 1210 may control the semiconductor device 1100 in response to the control command.

Figure 2:
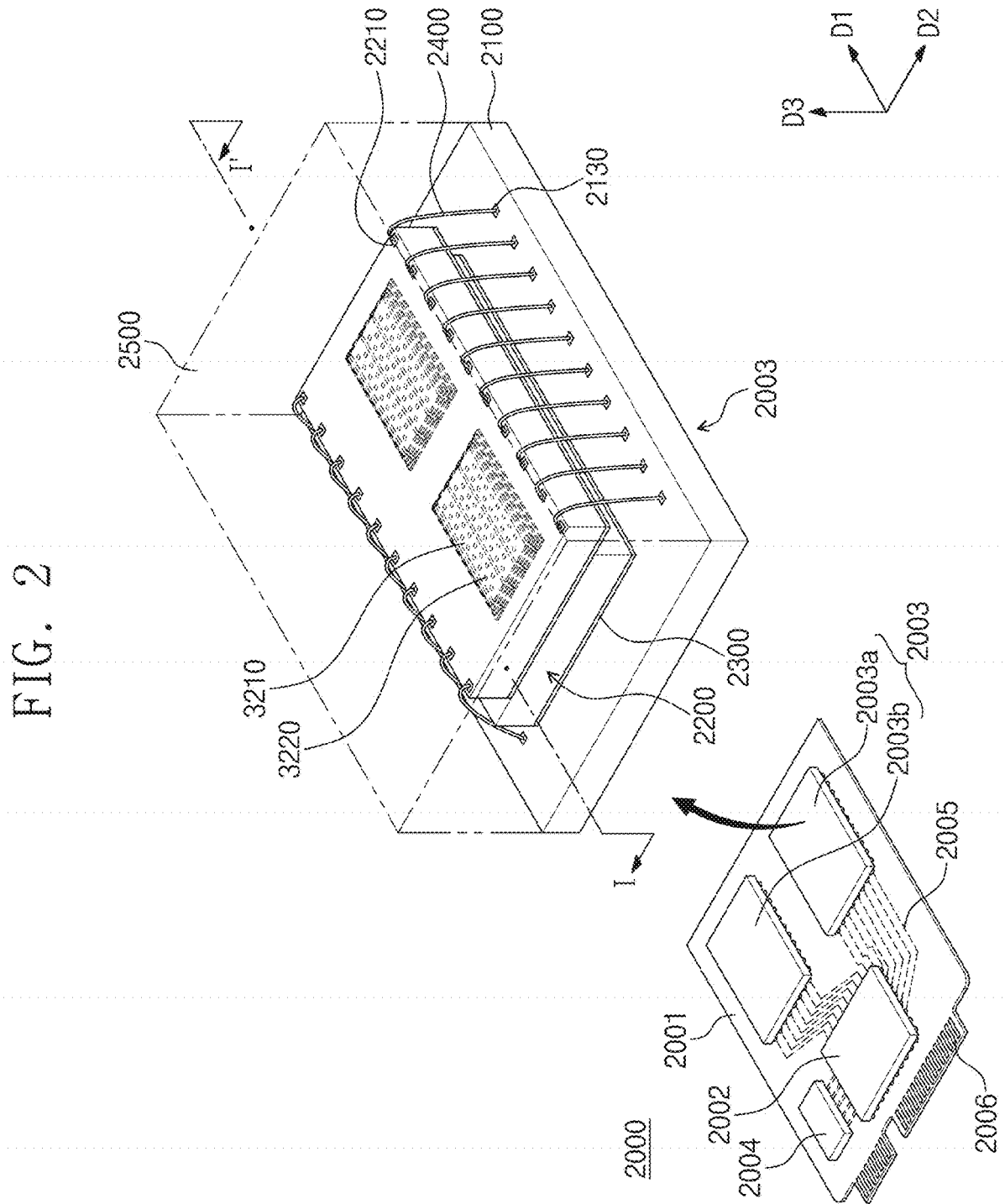
FIG. 2 is a perspective view schematically illustrating an electronic system including a semiconductor device according to some example embodiments of the inventive concepts.

FIG. 2 is a perspective view schematically illustrating an electronic system including a semiconductor device according to some example embodiments of the inventive concepts.

Referring to FIG. 2, an electronic system 2000 according to some example embodiments of the inventive concepts may include a main board 2001, a controller 2002, one or more semiconductor packages 2003, and a DRAM 2004. The controller 2002, the one or more semiconductor packages 2003 and the DRAM 2004 may be mounted on the main board 2001. The semiconductor package 2003 and the DRAM 2004 may be connected to the controller 2002 through interconnection patterns 2005 formed at the main board 2001.

The main board 2001 may include a connector 2006 including a plurality of pins coupled to an external host. The number and arrangement of the plurality of pins in the connector 2006 may be changed according to a communication interface between the electronic system 2000 and the external host. In some example embodiments, the electronic system 2000 may communicate with the external host through one of an universal serial bus (USB) interface, a peripheral component interconnect express (PCI-express) interface, a serial advanced technology attachment (SATA) interface, and a M-Phy interface for an universal flash storage (UFS). In some example embodiments, the electronic system 2000 may operate by power supplied from the external host through the connector 2006. The electronic system 2000 may further include a power management integrated circuit (PMIC) for distributing the power supplied from the external host to the controller 2002 and the semiconductor package 2003.

The controller 2002 may write data in the semiconductor package 2003 and/or read data from the semiconductor package 2003 and may improve an operation speed of the electronic system 2000.

The DRAM 2004 may be a buffer memory for reducing a speed difference between the external host and the semiconductor package 2003 corresponding to a data storage space. The DRAM 2004 included in the electronic system 2000 may also operate as a cache memory and may provide a space for temporarily storing data in an operation of controlling the semiconductor package 2003. In the case in which the electronic system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on bottom surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stack structures 3210 and vertical structures 3220. Each of the semiconductor chips 2200 may include a semiconductor device according to some example embodiments of the inventive concepts, which will be described later.

In some example embodiments, the connection structure 2400 may be a bonding wire electrically connecting the input/output pad 2210 to the package upper pad 2130. Thus, in each of the first and second semiconductor packages 2003a and 2003b, the semiconductor chips 2200 may be electrically connected to each other by the bonding wire method and may be electrically connected to the package upper pads 2130 of the package substrate 2100 by the bonding wire method. According to some example embodiments, in each of the first and second semiconductor packages 2003a and 2003b, the semiconductor chips 2200 may be electrically connected to each other by a connection structure including a through-silicon via (TSV), instead of the connection structure 2400 having the bonding wire.

In some example embodiments, the controller 2002 and the semiconductor chips 2200 may be included in a single package. For example, the controller 2002 and the semiconductor chips 2200 may be mounted on an interposer substrate different from the main board 2001, and the controller 2002 and the semiconductor chips 2200 may be connected to each other by interconnection lines formed at the interposer substrate.

Figure 3:
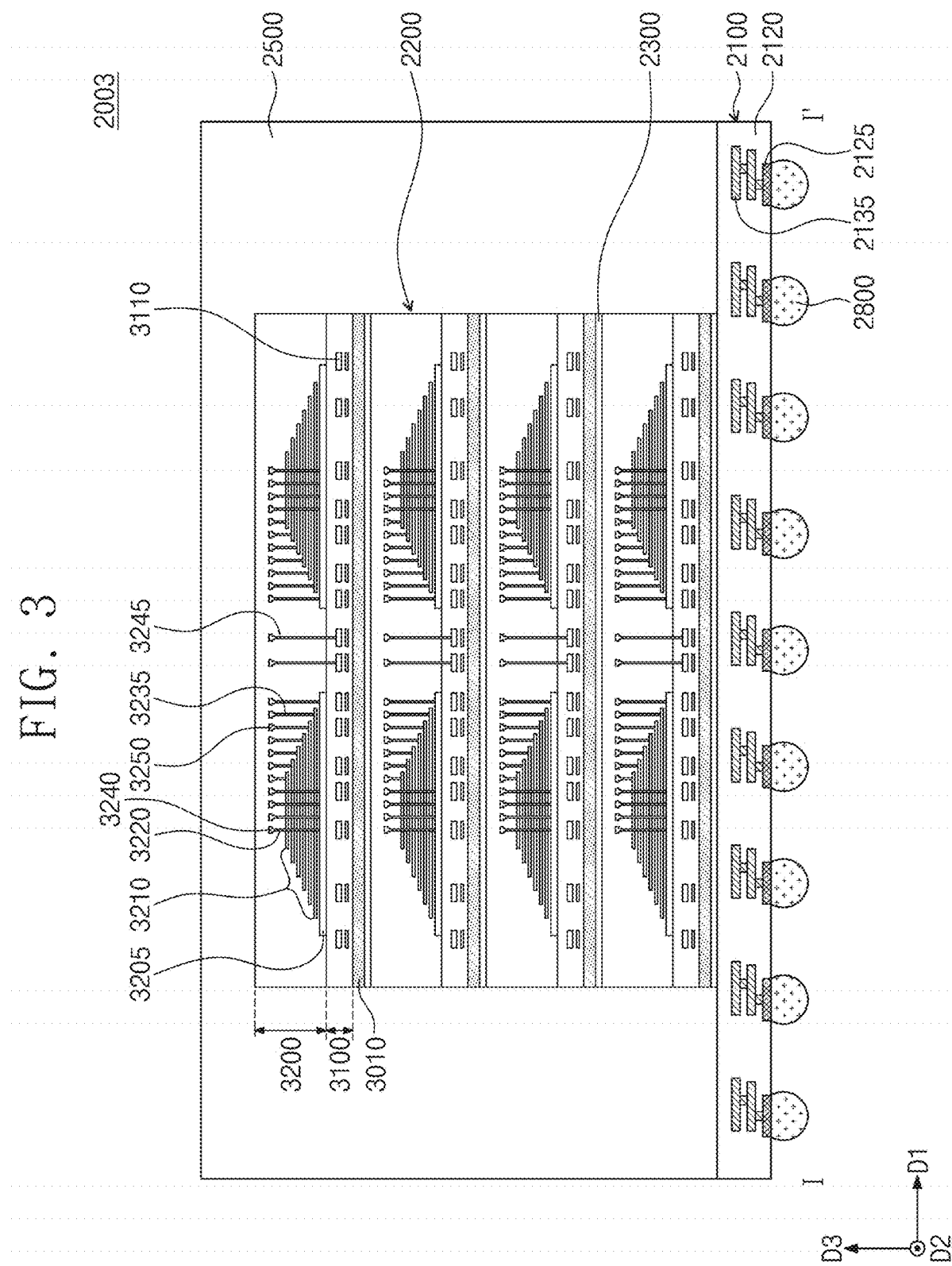
FIGS. 3 and 4 are cross-sectional views taken along a line I-I' of FIG. 2 to illustrate some example embodiments of the semiconductor package of FIG. 2.
Figure 4:
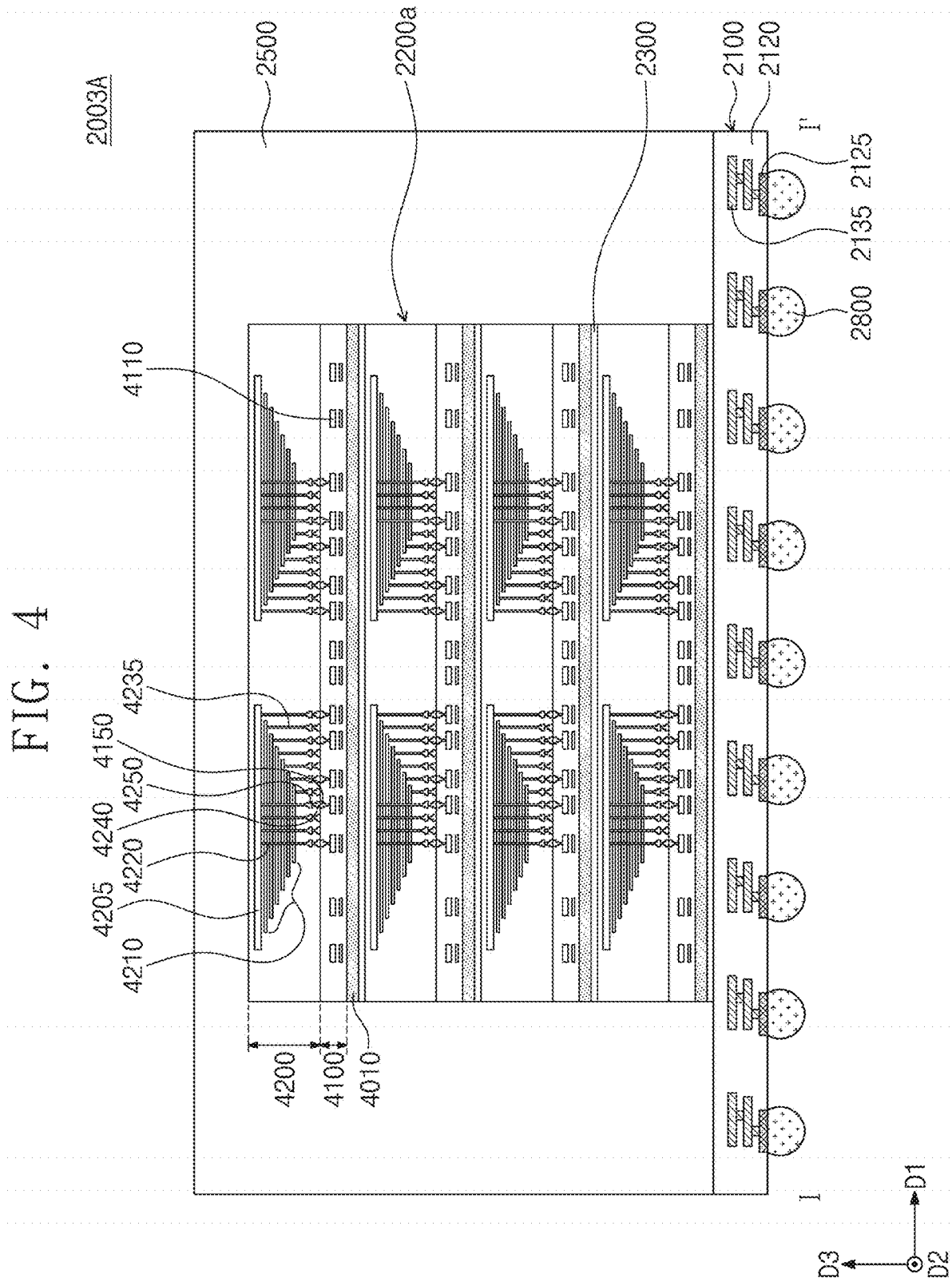

FIGS. 3 and 4 are cross-sectional views schematically illustrating semiconductor packages according to some example embodiments of the inventive concepts. FIGS. 3 and 4 are cross-sectional views taken along a line I-I' of FIG. 2 to illustrate some example embodiments of a semiconductor package of FIG. 2.

Referring to FIG. 3, in the semiconductor package 2003, the package substrate 2100 may be a printed circuit board. The package substrate 2100 may include a package substrate body portion 2120, the package upper pads 2130 (see FIG. 2) disposed on a top surface of the package substrate body portion 2120, package lower pads 2125 disposed on or exposed at a bottom surface of the package substrate body portion 2120, and internal interconnection lines 2135 disposed in the package substrate body portion 2120 to electrically connect the package upper pads 2130 to the package lower pads 2125. The package upper pads 2130 may be electrically connected to the connection structures 2400. The package lower pads 2125 may be connected to the interconnection patterns 2005 of the main board 2001 of the electronic system 2000 through conductive connection portions 2800, as illustrated in FIG. 2.

Each of the semiconductor chips 2200 may include a semiconductor substrate 3010, and first and second structures 3100 and 3200 sequentially stacked on the semiconductor substrate 3010. The first structure 3100 may include a peripheral circuit region including peripheral interconnection lines 3110. The second structure 3200 may include a source structure 3205, a stack structure 3210 on the source structure 3205, vertical structures 3220 penetrating the stack structure 3210, bit lines 3240 electrically connected to the vertical structures 3220, and cell contact plugs 3235 electrically connected to word lines (see WL of FIG. 1) of the stack structure 3210. The second structure 3200 of each of the semiconductor chips 2200 may further include separation structures to be described later.

Each of the semiconductor chips 2200 may include a through-interconnection line 3245 which is electrically connected to the peripheral interconnection line 3110 of the first structure 3100 and extends into the second structure 3200. The through-interconnection line 3245 may be disposed outside the stack structure 3210 and may further be disposed to penetrate (e.g., penetrate completely through) the stack structure 3210. Each of the semiconductor chips 2200 may further include the input/output pad 2210 (see FIG. 2) electrically connected to the peripheral interconnection lines 3110 of the first structure 3100.

Referring to FIG. 4, in a semiconductor package 2003A, each of semiconductor chips 2200a may include a semiconductor substrate 4010, a first structure 4100 on the semiconductor substrate 4010, and a second structure 4200 disposed on the first structure 4100 and bonded to the first structure 4100 by a wafer bonding method.

The first structure 4100 may include a peripheral circuit region including peripheral interconnection lines 4110 and first bonding structures 4150. The second structure 4200 may include a source structure 4205, a stack structure 4210 between the source structure 4205 and the first structure 4100, vertical structures 4220 penetrating the stack structure 4210, and second bonding structures 4250 electrically connected to the vertical structures 4220 and word lines (see WL of FIG. 1) of the stack structure 4210, respectively. For example, the second bonding structures 4250 may be electrically connected to the vertical structures 4220 and the word lines (see WL of FIG. 1) through bit lines 4240 electrically connected to the vertical structures 4220 and cell contact plugs 4235 electrically connected to the word lines (see WL of FIG. 1), respectively. The first bonding structures 4150 of the first structure 4100 may be in contact with (e.g., direct contact) and bonded to the second bonding structures 4250 of the second structure 4200. Bonded portions of the first bonding structures 4150 and the second bonding structures 4250 may be formed of, for example, copper (Cu).

Each of the semiconductor chips 2200a may include a source structure according to some example embodiments to be described later. Each of the semiconductor chips 2200a may further include the input/output pad 2210 (see FIG. 2) electrically connected to the peripheral interconnection lines 4110 of the first structure 4100.

The semiconductor chips 2200 of FIG. 3 (or the semiconductor chips 2200a of FIG. 4) may be electrically connected to each other by the connection structures 2400 having bonding wire shapes. Alternatively, in some example embodiments, semiconductor chips in a single semiconductor package (e.g., the semiconductor chips 2200 of FIG. 3 or the semiconductor chips 2200a of FIG. 4) may be electrically connected to each other by connection structures including through-silicon vias (TSVs).

Each of the first structures 3100 and 4100 of FIGS. 3 and 4 may correspond to a lower-level layer in some example embodiments to be described hereinafter, and each of the second structures 3200 and 4200 of FIGS. 3 and 4 may correspond to an upper-level layer in some example embodiments to be described hereinafter.

Figure 5:
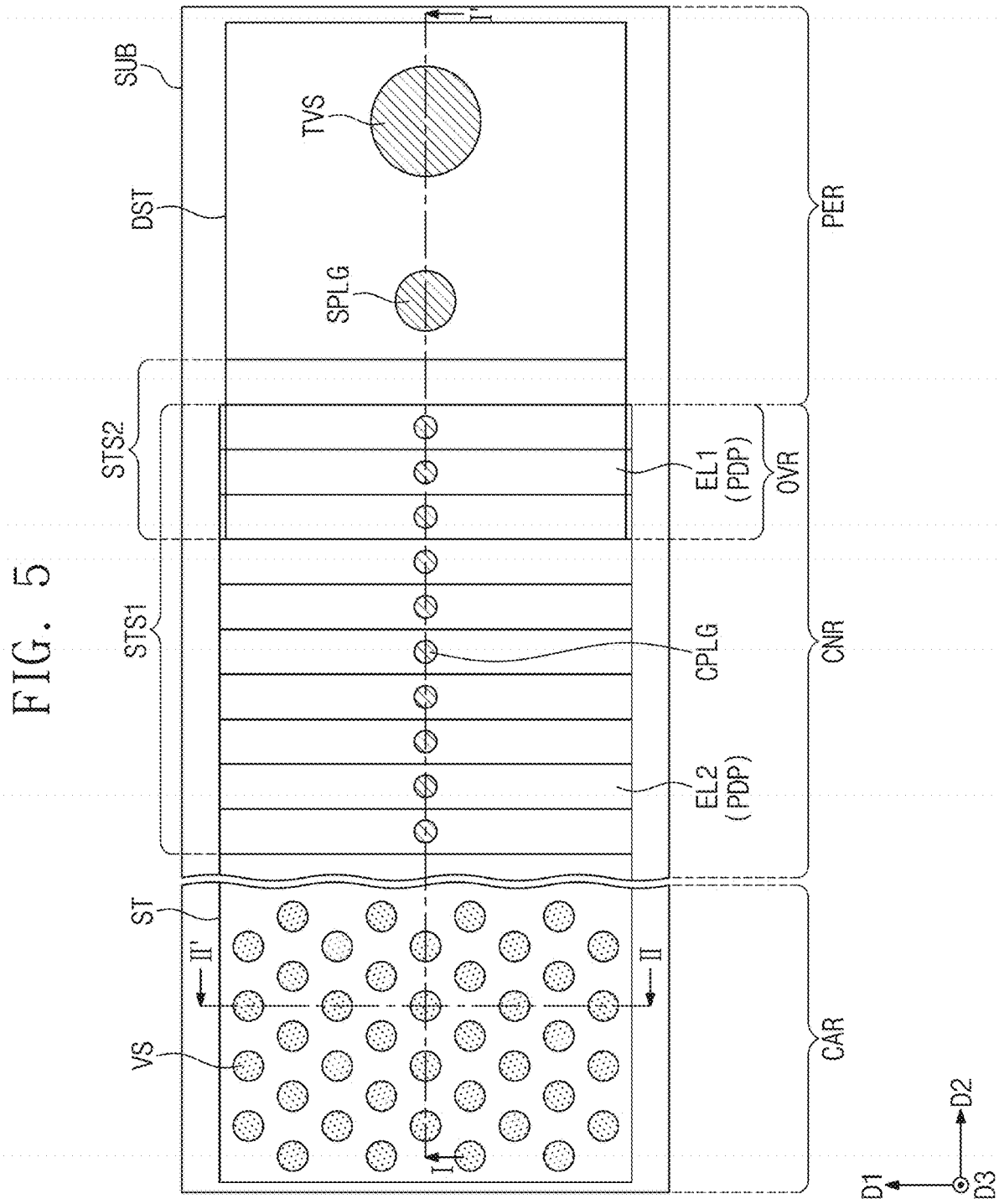
FIG. 5 is a plan view illustrating a semiconductor device according to some example embodiments of the inventive concepts.
Figure 6A:
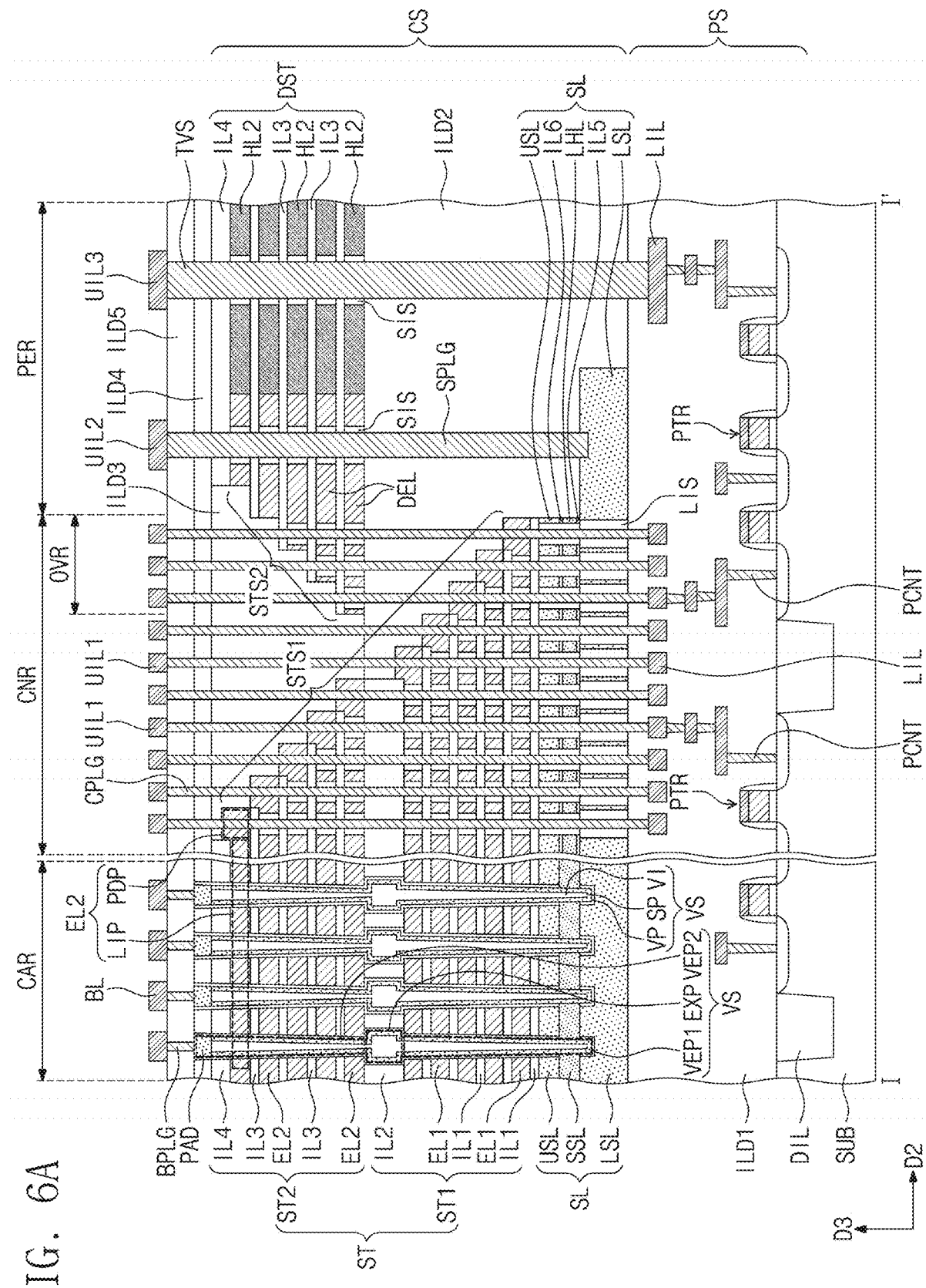
FIG. 6A is a cross-sectional view taken along a line I-I' of FIG. 5.
Figure 6B:
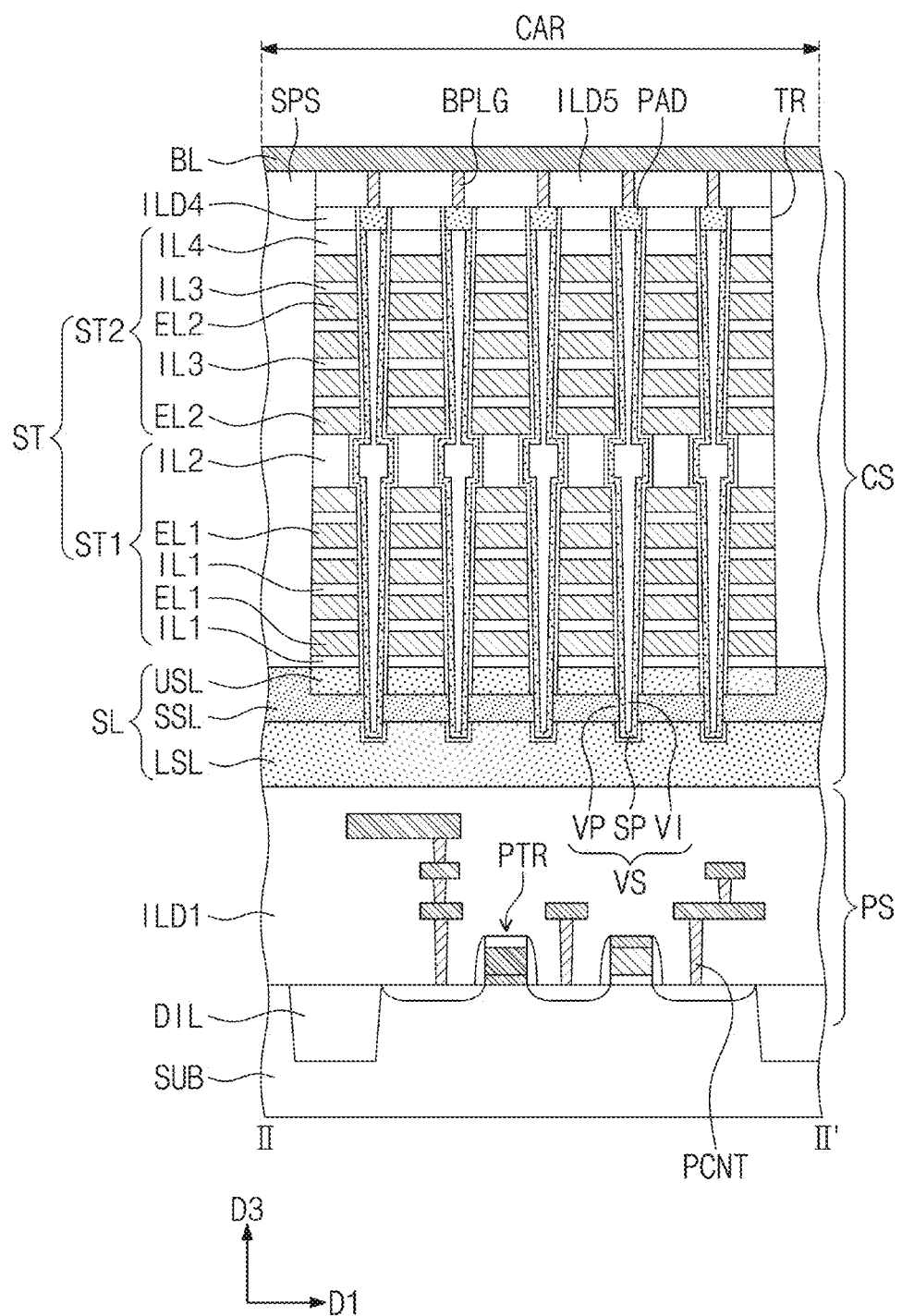
FIG. 6B is a cross-sectional view taken along a line II-II' of FIG. 5.

FIG. 5 is a plan view illustrating a semiconductor device according to some example embodiments of the inventive concepts. FIG. 6A is a cross-sectional view taken along a line I-I' of FIG. 5. FIG. 6B is a cross-sectional view taken along a line II-II' of FIG. 5.

Referring to FIGS. 5, 6A and 6B, a lower-level layer PS including peripheral transistors PTR may be disposed on a first substrate SUB. An upper-level layer CS including a cell array structure ST may be disposed on the lower-level layer PS. The first substrate SUB may include a silicon substrate, a silicon-germanium substrate, a germanium substrate, or a single-crystalline epitaxial layer grown on a single-crystalline silicon substrate. The first substrate SUB may include active regions defined by a device isolation layer DIL.

The lower-level layer PS may include a plurality of the peripheral transistors PTR disposed on the active regions of the first substrate SUB. The peripheral transistors PTR may constitute the decoder circuit, the page buffer and the logic circuit, described above.

The lower-level layer PS may include a peripheral circuit including the decoder circuit, the page buffer, and the logic circuit. In some example embodiments, the lower-level layer PS may further include lower interconnection lines LIL provided on the peripheral transistors PTR, and a first interlayer insulating layer ILD1 covering the peripheral transistors PTR and the lower interconnection lines LIL. A peripheral contact PCNT may be provided between the lower interconnection line LIL and the peripheral transistor PTR to electrically connect the lower interconnection line LIL and the peripheral transistor PTR. The first interlayer insulating layer ILD1 may include stacked insulating layers. For example, the first interlayer insulating layer ILD1 may include at least one of a silicon oxide layer, a silicon nitride layer, a silicon oxynitride layer, or a low-k dielectric layer. The upper-level layer CS may be provided on the first interlayer insulating layer ILD1 of the lower-level layer PS. The upper-level layer CS will be described hereinafter in more detail.

The upper-level layer CS may include a cell array region CAR, a cell contact region CNR, and a dummy region PER. The cell contact region CNR may be located between the cell array region CAR and the dummy region PER. The dummy region PER may be an outer region of a semiconductor chip. The cell contact region CNR may include an overlapping region OVR adjacent to the dummy region PER.

A second substrate SL may be provided on the first interlayer insulating layer ILD1. The second substrate SL may support the cell array structure ST provided in the cell array region CAR. The second substrate SL of the cell array region CAR may include a lower semiconductor layer LSL, a source semiconductor layer SSL and an upper semiconductor layer USL, which are sequentially stacked. Each of the lower semiconductor layer LSL, the source semiconductor layer SSL and the upper semiconductor layer USL may include a semiconductor material (e.g., silicon (Si), germanium (Ge), silicon-germanium (SiGe), gallium-arsenic (GaAs), indium-gallium-arsenic (InGaAs), aluminum-gallium-arsenic (AlGaAs), or any combination thereof). Each of the lower semiconductor layer LSL, the source semiconductor layer SSL and the upper semiconductor layer USL may be single-crystalline, amorphous and/or poly-crystalline. For example, each of the lower semiconductor layer LSL, the source semiconductor layer SSL and the upper semiconductor layer USL may include an N-type polysilicon layer doped with dopants. Dopant concentrations of the lower semiconductor layer LSL, the source semiconductor layer SSL and the upper semiconductor layer USL may be different from each other.

The source semiconductor layer SSL may be disposed between the lower semiconductor layer LSL and the upper semiconductor layer USL. The lower semiconductor layer LSL and the upper semiconductor layer USL may be electrically connected to each other through the source semiconductor layer SSL.

The second substrate SL of the cell contact region CNR may include the lower semiconductor layer LSL, a fifth insulating layer IL5, a lower sacrificial layer LHL, a sixth insulating layer IL6 and the upper semiconductor layer USL, which are sequentially stacked. Each of the fifth and sixth insulating layers IL5 and IL6 may include a silicon oxide layer, and the lower sacrificial layer LHL may include a silicon nitride layer or a silicon oxynitride layer.

The lower semiconductor layer LSL of the second substrate SL may extend from the cell array region CAR to the dummy region PER. The lower semiconductor layer LSL may extend to a portion of the dummy region PER but not extend to another portion of the dummy region PER. In other words, the lower semiconductor layer LSL may not be provided in the other portion of the dummy region PER.

The cell array structure ST may be provided on the second substrate SL of the cell array region CAR and the cell contact region CNR. The cell array structure ST may include a first stack structure ST1 and a second stack structure ST2 on the first stack structure ST1. A second interlayer insulating layer ILD2 and a third interlayer insulating layer ILD3 may be provided on the second substrate SL. A top surface of the second interlayer insulating layer ILD2 may be substantially coplanar with a top surface of the first stack structure ST1. A top surface of the third interlayer insulating layer ILD3 may be substantially coplanar with a top surface of the second stack structure ST2. The second and third interlayer insulating layers ILD2 and ILD3 may cover a first staircase structure STS1 of the cell array structure ST. As referred to herein, the "staircase structure" of the cell array structure ST will be understood to refer to a structure and/or portion of a structure (e.g., a cell array structure ST) of elements (e.g., electrodes EL1, insulating layers IL1, etc.) having different dimensions (e.g., lengths) in one or more directions that are perpendicular or substantially perpendicular to the "vertical direction" D3 (e.g., the second directions D2) and wherein elements of the structure have lengths in the one or more directions that vary in inverse proportion with distance in the third direction D3 from the substrate SUB (e.g., electrodes EL1 that are distal from the substrate SUB have a smaller length in direction D2 than electrodes EL1 that are proximate to the substrate SUB). As a result, and as shown in at least FIG. 6A, a height of the staircase structure in the third direction D3 is staggered in the second direction D2.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

The first stack structure ST1 may include first electrodes EL1 stacked in a vertical direction (e.g., a third direction D3) on the second substrate SL. The first stack structure ST1 may further include first insulating layers IL1 separating the stacked first electrodes EL1 from each other. The first insulating layers IL1 and the first electrodes EL1 of the first stack structure ST1 may be alternately stacked in the third direction D3. A second insulating layer IL2 may be provided at a top of the first stack structure ST1. The second insulating layer IL2 may be thicker than each of the first insulating layers IL1.

The second stack structure ST2 may include second electrodes EL2 stacked in the third direction D3 on the first stack structure ST1. The second stack structure ST2 may further include third insulating layers IL3 separating the stacked second electrodes EL2 from each other. The third insulating layers IL3 and the second electrodes EL2 of the second stack structure ST2 may be alternately stacked in the third direction D3. A fourth insulating layer IL4 may be provided at a top of the second stack structure ST2. The fourth insulating layer IL4 may be thicker than each of the third insulating layers IL3.

The first staircase structure STS1 may be provided in the cell contact region CNR. The first staircase structure STS1 may be a portion of the cell array structure ST, which extends from the cell array region CAR into the cell contact region CNR. In other words, the first and second electrodes EL1 and EL2 of the cell array structure ST may extend from the cell array region CAR into the cell contact region CNR to constitute the first staircase structure STS1 in the cell contact region CNR. The first staircase structure STS1 of the cell contact region CNR may be connected to the cell array structure ST of the cell array region CAR. A height of the first staircase structure STS1 may decrease as a distance from the dummy region PER decreases. In other words, the height of the first staircase structure STS1 may decrease toward a second direction D2.

A lowermost one of the first electrodes EL1 of the cell array structure ST may be a lower selection line (e.g., the second gate lower line LL2 of FIG. 1). An uppermost one of the second electrodes EL2 of the cell array structure ST may be an upper selection line (e.g., the first gate upper line UL1 of FIG. 1). The other first and second electrodes EL1 and EL2 except the lower selection line and the upper selection line may be word lines (e.g., the word lines WL of FIG. 1).

Each of the first and second electrodes EL1 and EL2 may include a line portion LIP extending from the cell array region CAR into the cell contact region CNR, and a pad portion PDP provided at an end of the line portion LIP. The pad portion PDP may be provided in the cell contact region CNR. A thickness of the pad portion PDP in the third direction D3 may be greater than a thickness of the line portion LIP in the third direction D3.

The pad portions PDP of the first and second electrodes EL1 and EL2 may constitute the first staircase structure STS1. The pad portions PDP of the first and second electrodes EL1 and EL2 may be exposed in order through the first staircase structure STS1. The pad portion PDP may be covered by the interlayer insulating layer ILD2 or ILD3.

The first and second electrodes EL1 and EL2 may include a conductive material. For example, the first and second electrodes EL1 and EL2 may include at least one of a doped semiconductor material (e.g., doped silicon), a metal (e.g., tungsten, copper, or aluminum), a conductive metal nitride (e.g., titanium nitride or tantalum nitride), a transition metal (e.g., titanium or tantalum), or a combination thereof. For example, each of the first to fourth insulating layers IL1 to IL4 may include a silicon oxide layer.

A plurality of vertical channel structures VS penetrating the cell array structure ST may be provided in the cell array region CAR. Each of the vertical channel structures VS may include a vertical insulating pattern VP, a vertical semiconductor pattern SP, and a filling insulation pattern VI. The vertical semiconductor pattern SP may be disposed between the vertical insulating pattern VP and the filling insulation pattern VI. A conductive pad PAD may be provided in an upper portion of each of the vertical channel structures VS.

The filling insulation pattern VI may have a cylindrical shape. The vertical semiconductor pattern SP may cover a surface of the filling insulation pattern VI and may extend from the lower semiconductor layer LSL to the conductive pad PAD in the third direction D3. The vertical semiconductor pattern SP may have a pipe shape having an opened top end. The vertical insulating pattern VP may cover an outer surface of the vertical semiconductor pattern SP and may extend from the lower semiconductor layer LSL to a top surface of a fourth interlayer insulating layer ILD4 in the third direction D3. The vertical insulating pattern VP may also have a pipe shape having an opened top end. The vertical insulating pattern VP may be disposed between the cell array structure ST and the vertical semiconductor pattern SP.

The vertical insulating pattern VP may be formed of a single layer or a multi-layer. In some example embodiments, the vertical insulating pattern VP may include a data storage layer. For example, the vertical insulating pattern VP may be a data storage layer of a NAND flash memory device and may include a tunnel insulating layer, a charge storage layer, and a blocking insulating layer. For example, the charge storage layer may include a trap insulating layer, a floating gate electrode, and/or an insulating layer including conductive nano dots. The charge storage layer may include at least one of a silicon nitride layer, a silicon oxynitride layer, a silicon-rich nitride layer, a nano-crystalline silicon layer, or a laminated trap layer.

The vertical semiconductor pattern SP may include a semiconductor material such as silicon (Si), germanium (Ge), or a combination thereof. In addition, the vertical semiconductor pattern SP may include a semiconductor material doped with dopants or an intrinsic semiconductor material not doped with dopants. The vertical semiconductor pattern SP including the semiconductor material may be used as channels of transistors constituting a memory cell string.

The conductive pad PAD may cover a top surface of the vertical semiconductor pattern SP and a top surface of the filling insulation pattern VI. The conductive pad PAD may include a semiconductor material doped with dopants, and/or a conductive material. A bit line contact plug BPLG may be electrically connected to the vertical semiconductor pattern SP through the conductive pad PAD.

The source semiconductor layer SSL may be in direct contact with a sidewall of a lower portion of each of the vertical semiconductor patterns SP. The source semiconductor layer SSL may electrically connect a plurality of the vertical semiconductor patterns SP to each other. In other words, the vertical semiconductor patterns SP may be electrically connected together to the second substrate SL. The second substrate SL may function as sources of memory cells. A common source voltage may be applied to the second substrate SL through a source contact plug SPLG to be described later.

Each of the vertical channel structures VS may include a first vertical extension VEP1 penetrating the first stack structure ST1, a second vertical extension VEP2 penetrating the second stack structure ST2, and an expansion portion EXP between the first and second vertical extensions VEP1 and VEP2. The expansion portion EXP may be provided in the second insulating layer IL2.

A diameter of the first vertical extension VEP1 may become progressively greater from its bottom toward its top. A diameter of the second vertical extension VEP2 may become progressively greater from its bottom toward its top. A diameter of the expansion portion EXP may be greater than a maximum diameter of the first vertical extension VEP1 and may be greater than a maximum diameter of the second vertical extension VEP2.

A plurality of separation structures SPS may penetrate the cell array structure ST (see FIG. 6B). The cell array structure ST may be horizontally divided into a plurality of structures by the separation structures SPS. For example, each of the electrodes EL1 and EL2 of the cell array structure ST may be horizontally divided into a plurality of electrodes by the separation structures SPS. The separation structures SPS may include an insulating material such as silicon oxide.

A dummy structure DST may be provided on the second interlayer insulating layer ILD2 of the dummy region PER. A bottom surface of the dummy structure DST may be coplanar with a bottom surface of the second stack structure ST2, and a top surface of the dummy structure DST may be coplanar with the top surface of the second stack structure ST2.

The dummy structure DST may extend from the dummy region PER into the overlapping region OVR of the cell contact region CNR. The dummy structure DST may have a second staircase structure STS2 in the overlapping region OVR. In other words, the second staircase structure STS2 may be provided in the overlapping region OVR, and the second staircase structure STS2 may be connected to the dummy structure DST of the dummy region PER. In the overlapping region OVR, the second staircase structure STS2 of the dummy structure DST may vertically overlap with the first staircase structure STS1 of the cell array structure ST. In the overlapping region OVR, the dummy structure DST may vertically overlap with at least a portion of the first staircase structure STS1. On the other hand, the second staircase structure STS2 of the dummy structure DST may be offset in the second direction D2 from a portion of the first staircase structure STS1, which is located at the same level as the second staircase structure STS2, without overlapping with the portion of the first staircase structure STS1.

The dummy structure DST may include first layers HL2 stacked in the third direction D3 on the second interlayer insulating layer ILD2. The dummy structure DST may further include the third insulating layers IL3 separating the stacked first layers HL2 from each other. The fourth insulating layer IL4 may be provided at a top of the dummy structure DST.

The dummy structure DST of the overlapping region OVR may include second layers DEL stacked in the third direction D3 on the second interlayer insulating layer ILD2. The second layers DEL may be adjacent to the first staircase structure STS1 of the second stack structure ST2. The second layers DEL may be provided at the same levels as the first layers HL2 corresponding thereto, respectively. The second layers DEL may be connected to the first layers HL2 corresponding thereto, respectively. The second layers DEL of the overlapping region OVR may constitute the second staircase structure STS2.

The first layers HL2 may include a different material from that of the second layers DEL. For example, the first layers HL2 may include an insulating material such as a silicon insulator, and the second layers DEL may include a conductive material such as a metal.

The second layers DEL may extend from the overlapping region OVR into a portion of the dummy region PER. In other words, the first layers HL2 may be provided instead of the second layers DEL in another portion of the dummy region PER except the portion of the dummy region PER.

A fourth interlayer insulating layer ILD4 may be provided on the cell array structure ST, the dummy structure DST and the third interlayer insulating layer ILD3. A fifth interlayer insulating layer ILD5 may be provided on the fourth interlayer insulating layer ILD4.

The dummy structure DST may be provided in an outer region of the semiconductor chip to function as a buffer structure buffering between a cell region and the outer region of the semiconductor chip. For example, due to the dummy structure DST, a level of a top surface of each of the fourth and fifth interlayer insulating layers ILD4 and ILD5 of the cell array region CAR may be substantially the same as a level of a top surface of each of the fourth and fifth interlayer insulating layers ILD4 and ILD5 of the dummy region PER. In other words, the dummy structure DST may prevent or reduce the top surface of the interlayer insulating layer ILD4 or ILD5 from becoming lower from the cell array region CAR toward the dummy region PER.

Bit line contact plugs BPLG may penetrate the fifth interlayer insulating layer ILD5 so as to be connected to the conductive pads PAD, respectively. A plurality of bit lines BL may be disposed on the fifth interlayer insulating layer ILD5. The bit lines BL may extend in a first direction D1 in parallel to each other. The bit lines BL may be electrically connected to the vertical channel structures VS through the bit line contact plugs BPLG.

A plurality of first upper interconnection lines UIL1 may be provided on the fifth interlayer insulating layer ILD5 of the cell contact region CNR. Cell contact plugs CPLG may vertically extend from the first upper interconnection lines UIL1 to the lower interconnection lines LIL of the lower-level layer PS.

The cell contact plugs CPLG may penetrate the first staircase structure STS1 of the cell array structure ST. The cell contact plugs CPLG may penetrate the second substrate SL disposed under the cell array structure ST.

Particularly, the cell contact plug CPLG may be connected directly to the pad portion PDP of an uppermost electrode among the electrodes EL1 and EL2 which the cell contact plug CPLG penetrates. The other electrodes except the uppermost electrode may be disconnected from the cell contact plug CPLG by a sidewall insulator SIS. The sidewall insulator SIS may be disposed between the cell contact plug CPLG and each of the other electrodes.

In some example embodiments, the sidewall insulator SIS may also be provided between the second substrate SL and the cell contact plug CPLG. A lower insulator LIS may be provided between the lower semiconductor layer LSL and the cell contact plug CPLG.

According to some example embodiments of the inventive concepts, the first upper interconnection line UIL1 and the lower interconnection line LIL may be vertically connected to each other by the cell contact plug CPLG. The electrode EL1 or EL2 may be connected to the first upper interconnection line UIL1 and/or the lower interconnection line LIL through the cell contact plug CPLG. In particular, since the electrode EL1 or EL2 is connected directly to the lower-level layer PS through the cell contact plug CPLG, a signal transmission path therebetween may be shortened. Thus, an operating speed of the semiconductor device may be improved.

The cell contact plug CPLG in the overlapping region OVR may penetrate the second staircase structure STS2 of the dummy structure DST as well as the first staircase structure STS1 of the cell array structure ST. The sidewall insulator SIS may also be provided between the second layer DEL and the cell contact plug CPLG, and thus the cell contact plug CPLG may be disconnected from the second layer DEL.

A second upper interconnection line UIL2 may be provided on the fifth interlayer insulating layer ILD5 of the dummy region PER. A source contact plug SPLG may vertically extend from the second upper interconnection line UIL2 to the lower semiconductor layer LSL. The source contact plug SPLG may penetrate the dummy structure DST. The sidewall insulator SIS may also be disposed between the source contact plug SPLG and the second layer DEL of the dummy structure DST, and thus the source contact plug SPLG may be disconnected from the second layer DEL.

The second upper interconnection line UIL2 may be connected to the second substrate SL through the source contact plug SPLG. A common source voltage may be applied from the second upper interconnection line UIL2 to the second substrate SL through the source contact plug SPLG.

A third upper interconnection line UIL3 may be provided on the fifth interlayer insulating layer ILD5 of the dummy region PER. A through-via TVS may vertically extend from the third upper interconnection line UIL3 to the lower interconnection line LIL of the lower-level layer PS. The through-via TVS may penetrate the dummy structure DST. The sidewall insulator SIS may also be disposed between the through-via TVS and the first layer HL2 of the dummy structure DST.

According to some example embodiments of the inventive concepts, the dummy structure DST may be very adjacent to the cell array structure ST. In particular, at least a portion of the dummy structure DST may vertically overlap with the first staircase structure STS1 in the overlapping region OVR. Thus, an area of the dummy region PER in which the dummy structure DST is disposed may be reduced, and a size of the semiconductor chip may be reduced. In other words, according to some example embodiments of the inventive concepts, an integration density of the semiconductor device may be improved.

According to some example embodiments of the inventive concepts, even though the dummy structure DST vertically overlaps with at least a portion of the first staircase structure STS1, the cell contact plug CPLG may be connected to a corresponding one of the first electrodes EL1 of the first stack structure ST1 by using the sidewall insulator SIS. In other words, the cell contact plug CPLG penetrating the dummy structure DST may be disconnected from the second layer DEL by the sidewall insulator SIS. Thus, it is possible to realize the overlapping region OVR which does not affect, or has a limited effect on, reliability and/or electrical characteristics of the semiconductor device.

FIGS. 7A, 8A, 9A, 10A, 11A, 12A, 13A, 14A and 15A are cross-sectional views taken along the line I-I' of FIG. 5 to illustrate a method of manufacturing a semiconductor device according to some example embodiments of the inventive concepts. FIGS. 7B, 8B, 9B, 10B, 11B, 12B, 13B, 14B and 15B are cross-sectional views taken along the line II-II' of FIG. 5 to illustrate a method of manufacturing a semiconductor device according to some example embodiments of the inventive concepts.

Figure 7A:
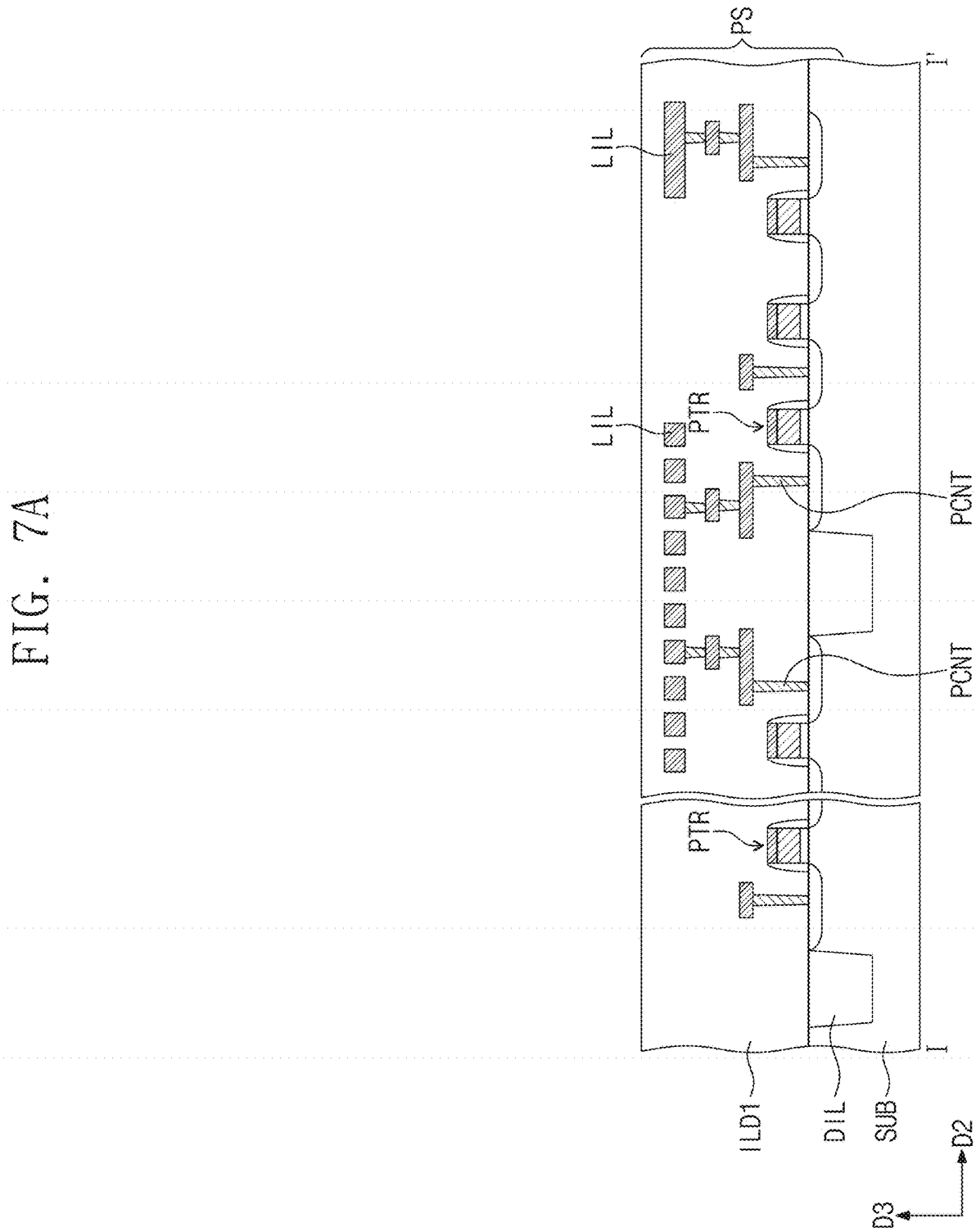
Figure 7B:
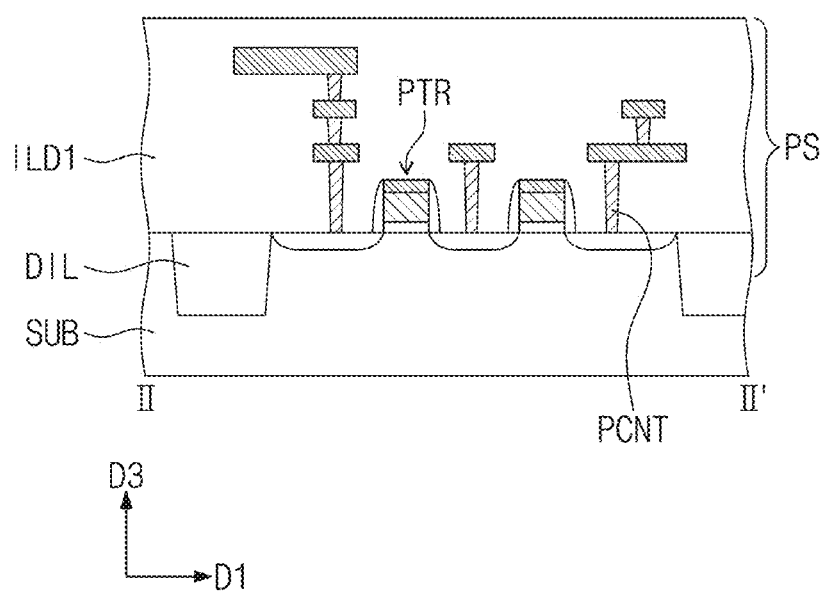
FIGS. 7B, 8B, 9B, 10B, 11B, 12B, 13B, 14B and 15B are cross-sectional views taken along the line II-II' of FIG. 5 to illustrate a method of manufacturing a semiconductor device according to some example embodiments of the inventive concepts.

Referring to FIGS. 5, 7A and 7B, a lower-level layer PS may be formed on a first substrate SUB. The formation of the lower-level layer PS may include forming peripheral transistors PTR on the first substrate SUB, and forming lower interconnection lines LIL on the peripheral transistors PTR. For example, the formation of the peripheral transistors PTR may include forming a device isolation layer DIL in the first substrate SUB to define active regions, forming a gate insulating layer and gate electrodes on the active regions, and injecting dopants into the active regions to form source/drain regions. A first interlayer insulating layer ILD1 covering the peripheral transistors PTR and the lower interconnection lines LIL may be formed.

Figure 8A:
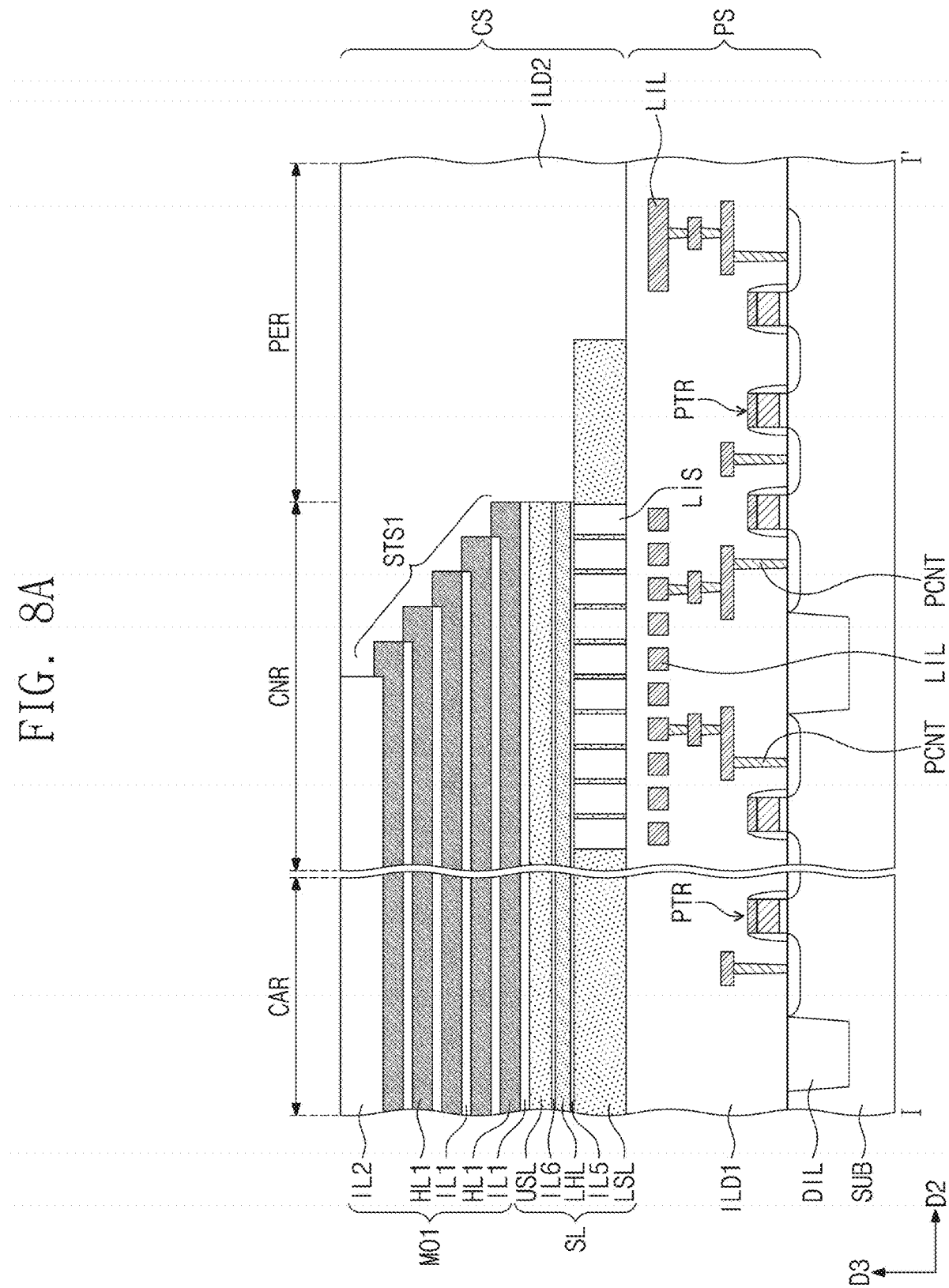
Figure 8B:
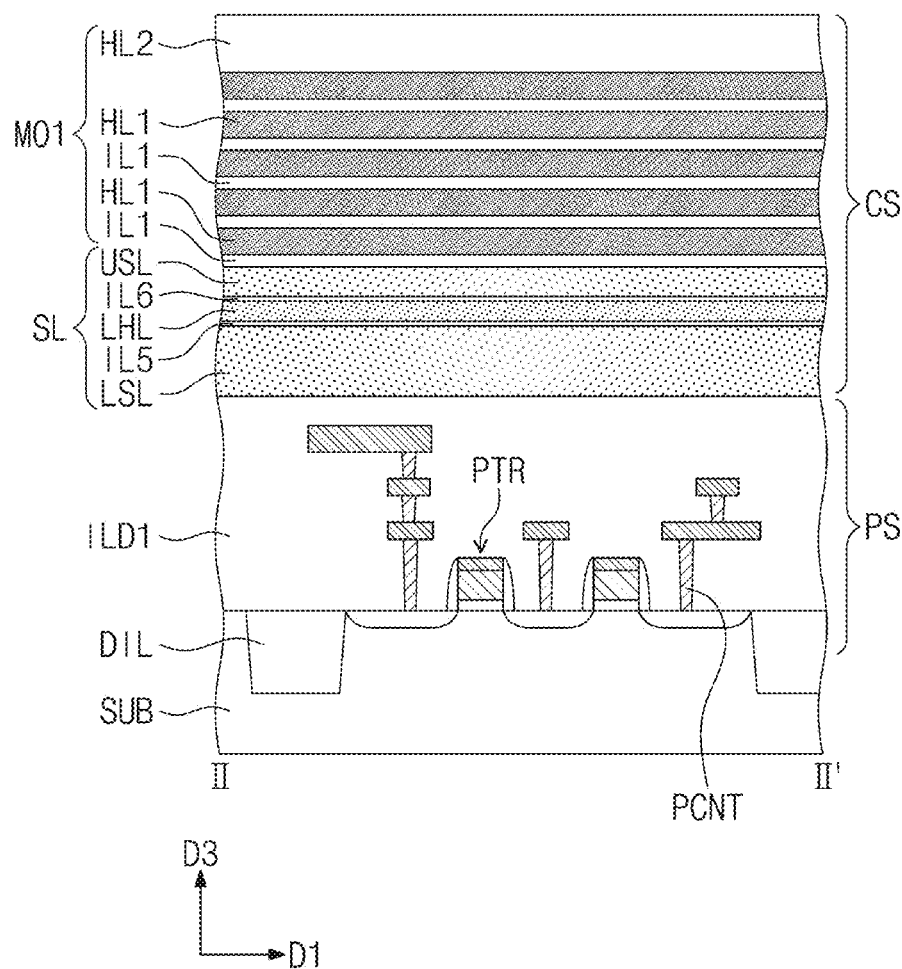

Referring to FIGS. 5, 8A and 8B, an upper-level layer CS including a cell array region CAR, a cell contact region CNR and a dummy region PER may be formed on the first interlayer insulating layer ILD1. More particularly, a second substrate SL may be formed on the first interlayer insulating layer ILD1. The formation of the second substrate SL may include sequentially forming a lower semiconductor layer LSL, a fifth insulating layer IL5, a lower sacrificial layer LHL, a sixth insulating layer IL6 and an upper semiconductor layer USL. For example, the lower semiconductor layer LSL and the upper semiconductor layer USL may include a semiconductor material such as poly-silicon. Each of the fifth and sixth insulating layers IL5 and IL6 may include a silicon oxide layer, and the lower sacrificial layer LHL may include a silicon nitride layer or a silicon oxynitride layer. In some example embodiments, before the formation of the fifth insulating layer IL5, lower insulators LIS may be formed in the lower semiconductor layer LSL of the cell contact region CNR.

A first mold structure MO1 may be formed on the second substrate SL. For example, first insulating layers IL1 and first sacrificial layers HL1 may be alternately stacked on the upper semiconductor layer USL to form the first mold structure MO1. A second insulating layer IL2 may be formed at a top of the first mold structure MO1.

The first insulating layers IL1, the first sacrificial layers HL1 and the second insulating layer IL2 may be deposited using a thermal chemical vapor deposition (thermal CVD) process, a plasma-enhanced CVD process, a physical CVD process, and/or an atomic layer deposition (ALD) process. For example, each of the first and second insulating layers IL1 and IL2 may include a silicon oxide layer, and each of the first sacrificial layers HL1 may include a silicon nitride layer or a silicon oxynitride layer.

A first staircase structure STS1 may be formed at the first mold structure MO1 of the cell contact region CNR. For example, a cycle process may be performed on the first mold structure MO1 to form the first staircase structure STS1 in the cell contact region CNR. The formation of the first staircase structure STS1 may include forming a mask pattern (not shown) on the first mold structure MO1, and repeatedly performing a cycle using the mask pattern a plurality of times. The cycle may include a process of etching a portion of the first mold structure MO1 by using the mask pattern as an etch mask, and a trimming process of shrinking the mask pattern.

A second interlayer insulating layer ILD2 may be formed on the first mold structure MO1. The formation of the second interlayer insulating layer ILD2 may include forming an insulating layer covering the first mold structure MO1, and performing a planarization process on the insulating layer until the second insulating layer IL2 is exposed.

Figure 9A:
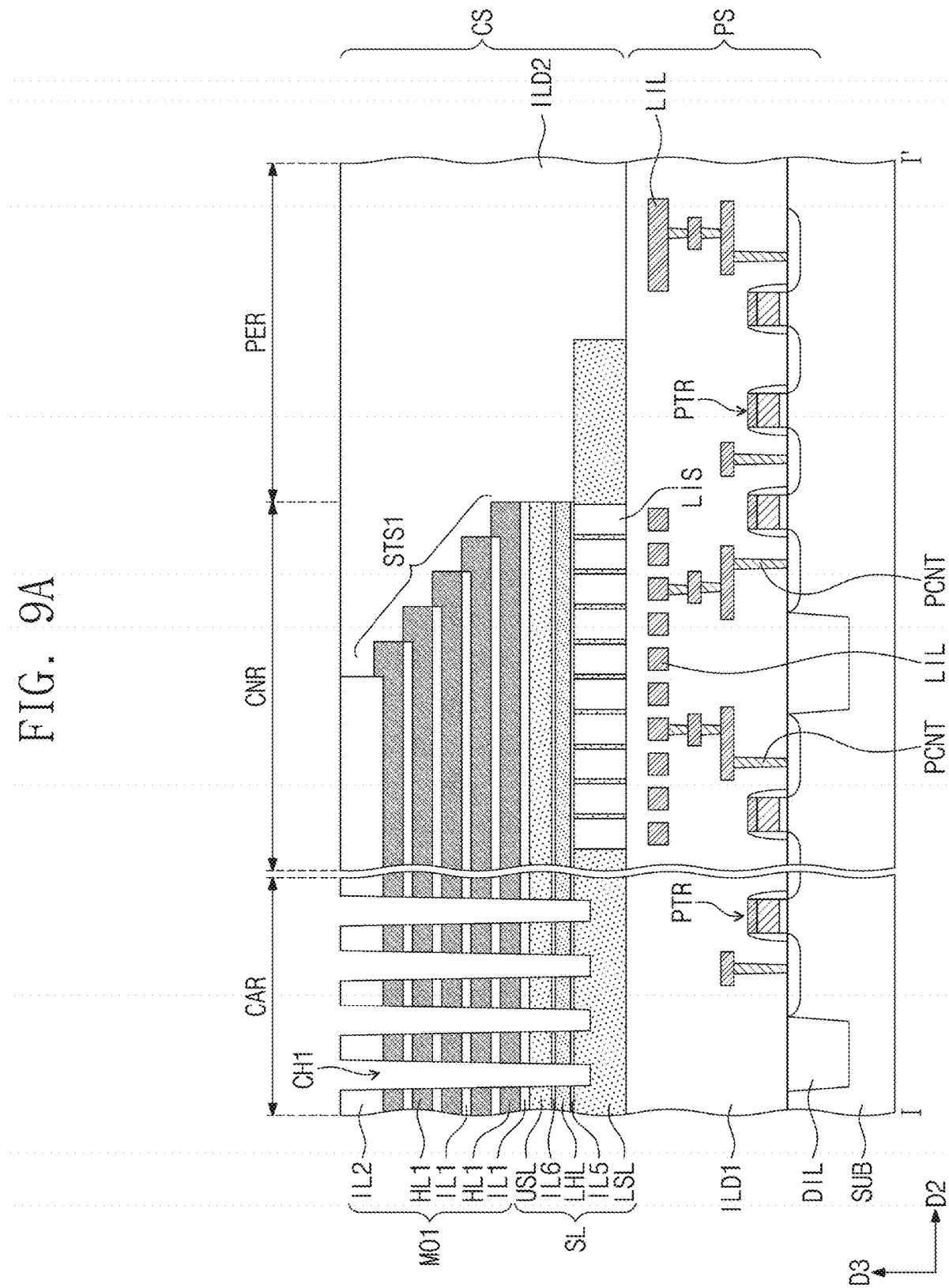
Figure 9B:
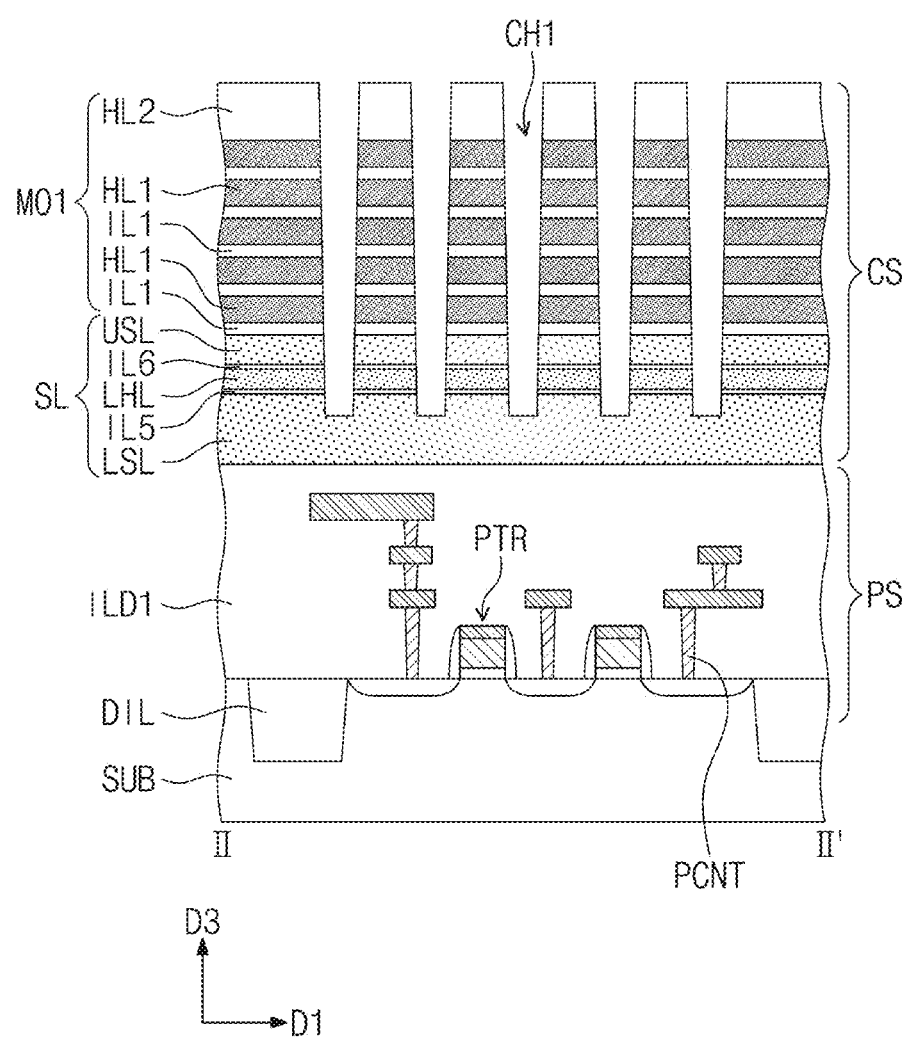

Referring to FIGS. 5, 9A and 9B, first channel holes CH1 may be formed to penetrate the first mold structure MO1 of the cell array region CAR. Each of the first channel holes CH1 may expose the lower semiconductor layer LSL.

For example, the formation of the first channel holes CH1 may include forming a mask pattern (not shown) having openings defining the first channel holes CH1 on the first mold structure MO1, and anisotropically etching the first mold structure MO1 using the mask pattern as an etch mask. The anisotropic etching process may include a plasma etching process, a reactive ion etching (RIE) process, an inductively coupled plasma reactive ion etching (ICP-RIE) process, or an ion beam etching (IBE) process.

In some example embodiments, a patterning process for forming the first channel holes CH1 may include a lithography process using extreme ultraviolet (EUV) light. EUV light may mean ultraviolet light having a wavelength of 4 nm to 124 nm (particularly, a wavelength of 4 nm to 20 nm, more particularly, a wavelength of 13.5 nm). The EUV light may mean light having an energy of 6.21 eV to 124 eV (in particular, an energy of 90 eV to 95 eV).

The lithography process using the EUV light may include an exposure process using the EUV light irradiated onto a photoresist layer, and a development process. For example, the photoresist layer may include an organic photoresist containing an organic polymer such as polyhydroxystyrene. The organic photoresist may further include a photosensitive compound capable of reacting to the EUV light. The organic photoresist may additionally include a material having a high absorption rate for the EUV light, for example, an organometallic material, an iodine-containing material, and/or a fluorine-containing material. For other examples, the photoresist layer may include an inorganic photoresist containing an inorganic material such as tin oxide.

The photoresist layer may be formed with a relatively thin thickness. The photoresist layer exposed to the EUV light may be developed to form photoresist patterns. The photoresist patterns may have, but are not limited to, line shapes extending in one direction, island shapes, a zigzag form, a honeycomb form, or circular shapes when viewed in a plan view.

One or more mask layers stacked under the photoresist patterns may be patterned using the photoresist patterns as etch masks to form mask patterns. A target layer may be patterned using the mask patterns as etch masks to form desired patterns on a wafer.

In a comparative example, a multi patterning technique (MPT) using two or more photomasks may be required to form patterns having a fine pitch on a wafer. On the contrary, when the EUV lithography process according to some example embodiments of the inventive concepts is performed, the first channel holes CH1 having a fine pitch may be formed using a single photomask.

For example, a minimum pitch between the first channel holes CH1 realized by the EUV lithography process of some example embodiments may be 45 nm or less. In other words, since the EUV lithography process is performed, the first channel holes CH1, which are precise and fine, may be formed without the multi patterning technique.

Figure 10A:
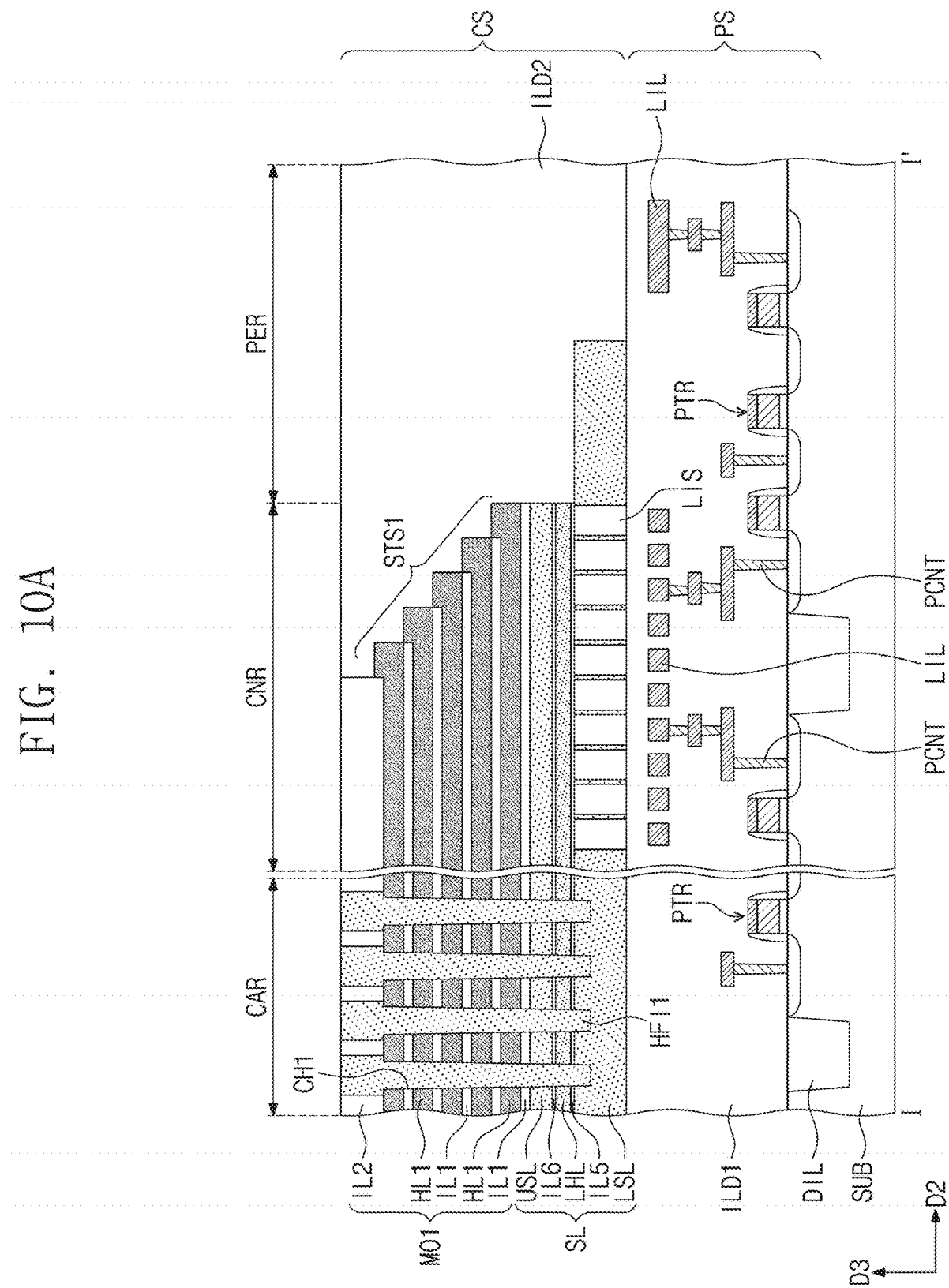
Figure 10B:
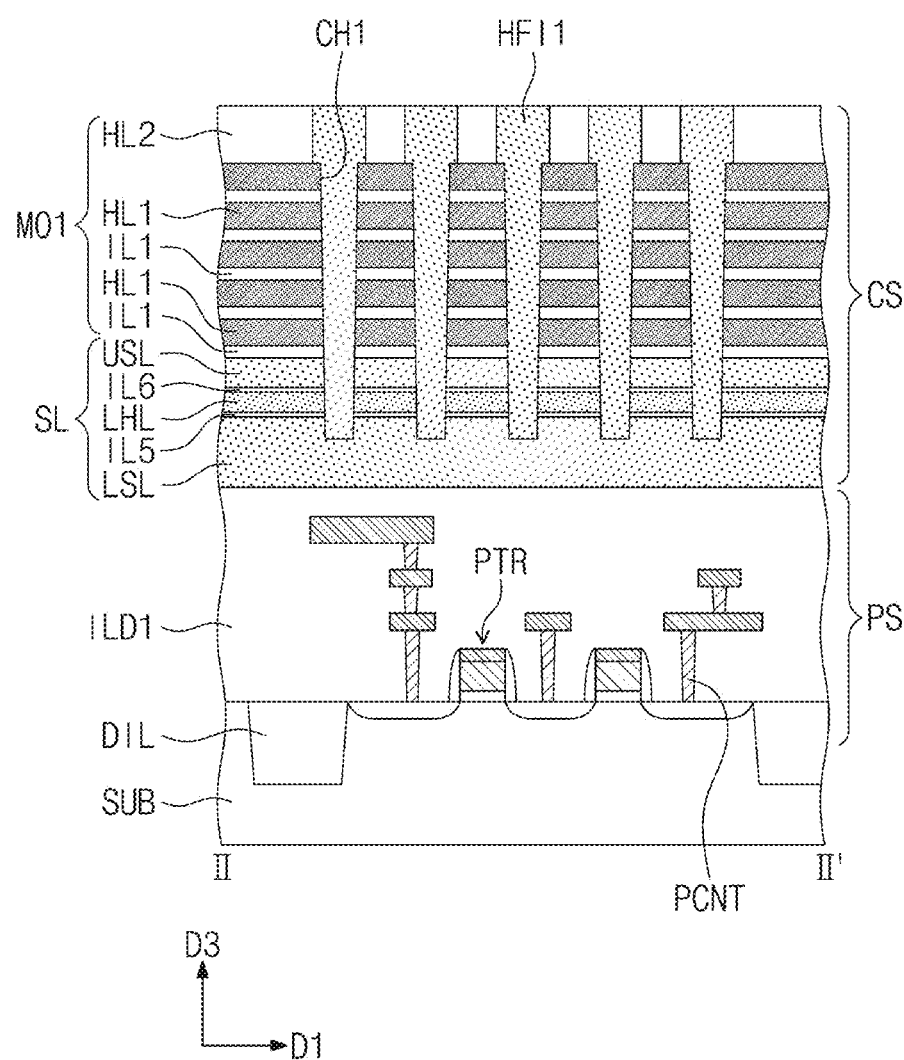

Referring to FIGS. 5, 10A and 10B, an upper portion of each of the first channel holes CH1 may be expanded. Thus, a diameter of the first channel hole CH1 may be significantly increased in the second insulating layer IL2.

First sacrificial pillars HFI1 may be formed to fill the first channel holes CH1, respectively. For example, the formation of the first sacrificial pillars HFI1 may include forming a first sacrificial mask layer filling the first channel holes CH1, and planarizing the first sacrificial mask layer until a top surface of the second insulating layer IL2 is exposed. For example, the first sacrificial mask layer may include poly-silicon.

Figure 11A:
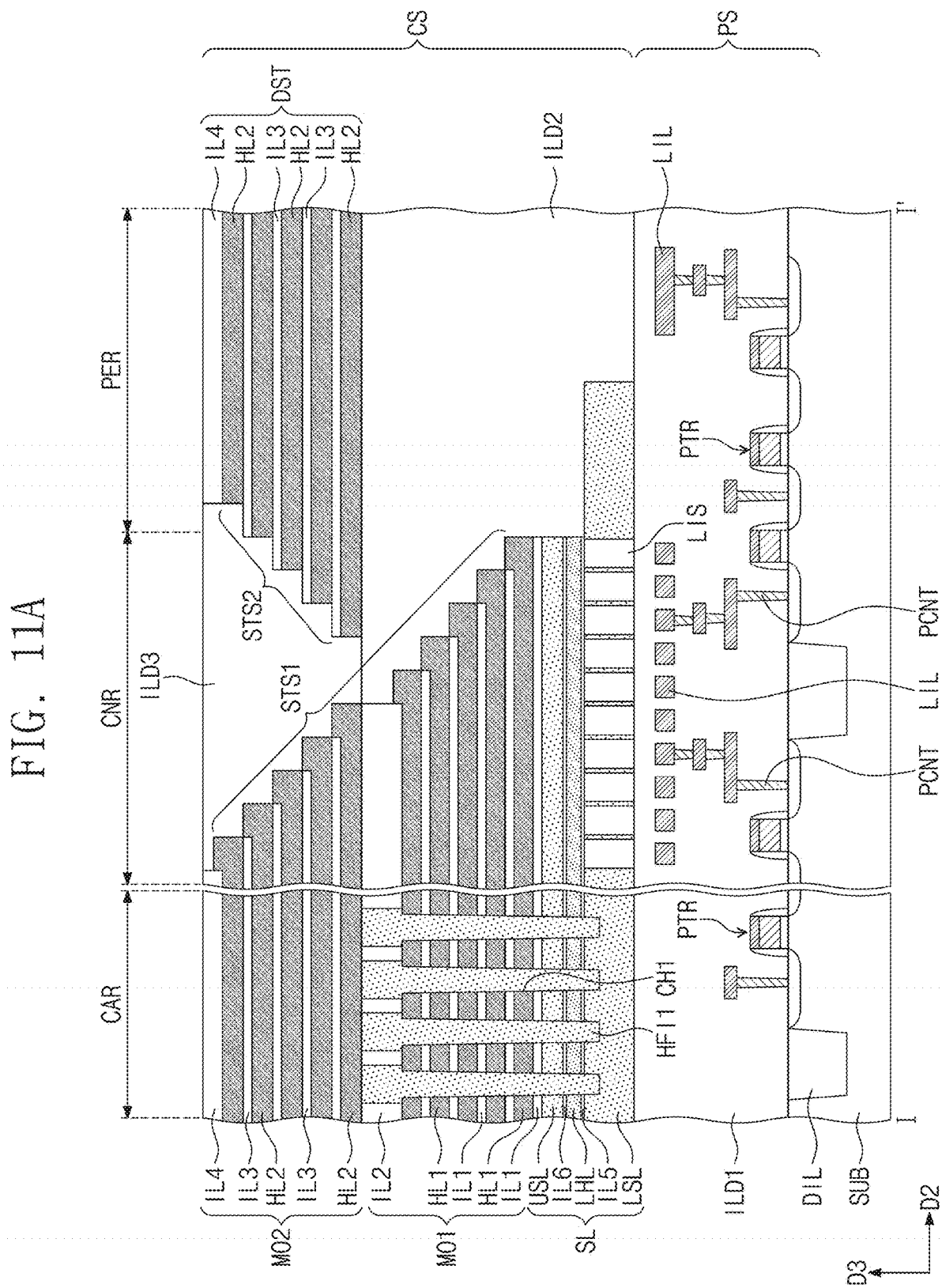
Figure 11B:
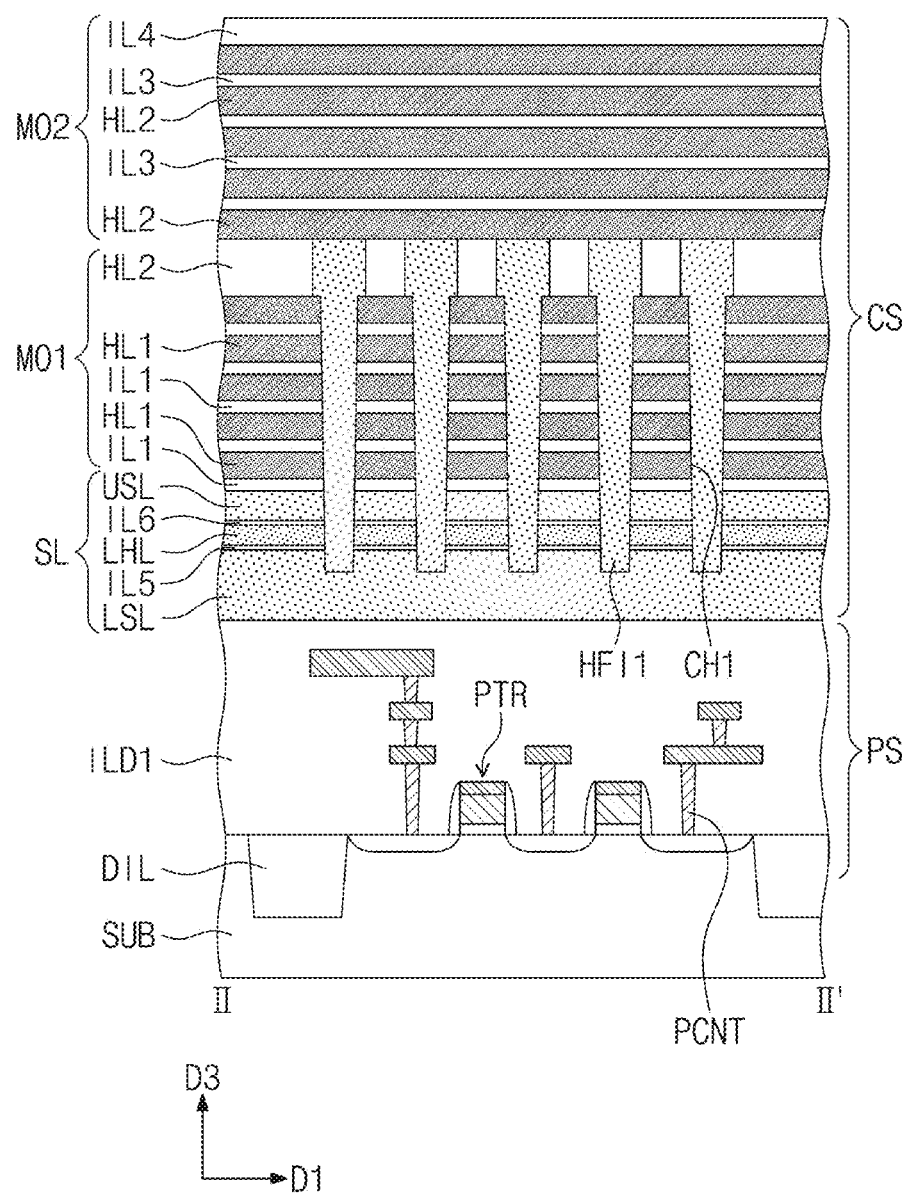

Referring to FIGS. 5, 11A and 11B, a second mold structure MO2 may be formed on the first mold structure MO1 of the cell array region CAR, and a dummy structure DST may be formed on the second interlayer insulating layer ILD2 of the dummy region PER. The formation of the second mold structure MO2 and the dummy structure DST may include alternately stacking third insulating layers IL3 and first layers HL2 (hereinafter, referred to as second sacrificial layers HL2) on the first mold structure MO1 and the second interlayer insulating layer ILD2, and forming a first staircase structure STS1 and a second staircase structure STS2 by performing a cycle process on a stack structure in which the third insulating layers IL3 and the second sacrificial layers HL2 are alternately stacked. The cycle process may be substantially the same as the aforementioned cycle process for forming the first staircase structure STS1 of the first mold structure MO1.

The second mold structure MO2 may have the first staircase structure STS1, and the dummy structure DST may have the second staircase structure STS2. The first staircase structure STS1 of the second mold structure MO2 may be connected to the first staircase structure STS1 of the first mold structure MO1.

A fourth insulating layer IL4 may be formed at a top of each of the second mold structure MO2 and the dummy structure DST. For example, each of the third and fourth insulating layers IL3 and IL4 may include a silicon oxide layer, and each of the second sacrificial layers HL2 may include a silicon nitride layer or a silicon oxynitride layer.

At least a portion of the second staircase structure STS2 of the dummy structure DST may vertically overlap with the first staircase structure STS1 of the first mold structure MO1. A region in which the first and second staircase structures STS1 and STS2 vertically overlap with each other may be defined as an overlapping region OVR. The overlapping region OVR may be included in the cell contact region CNR. Meanwhile, the second staircase structure STS2 of the dummy structure DST may be offset in the second direction D2 from the first staircase structure STS1 of the second mold structure MO2 without overlapping with the first staircase structure STS1 of the second mold structure MO2.

A third interlayer insulating layer ILD3 may be formed on the second mold structure MO2 and the dummy structure DST. The formation of the third interlayer insulating layer ILD3 may include forming an insulating layer covering the second mold structure MO2 and the dummy structure DST, and performing a planarization process on the insulating layer until the fourth insulating layer IL4 is exposed. The third interlayer insulating layer ILD3 may cover the first staircase structure STS1 of the second mold structure MO2 and the second staircase structure STS2 of the dummy structure DST.

Figure 12A:
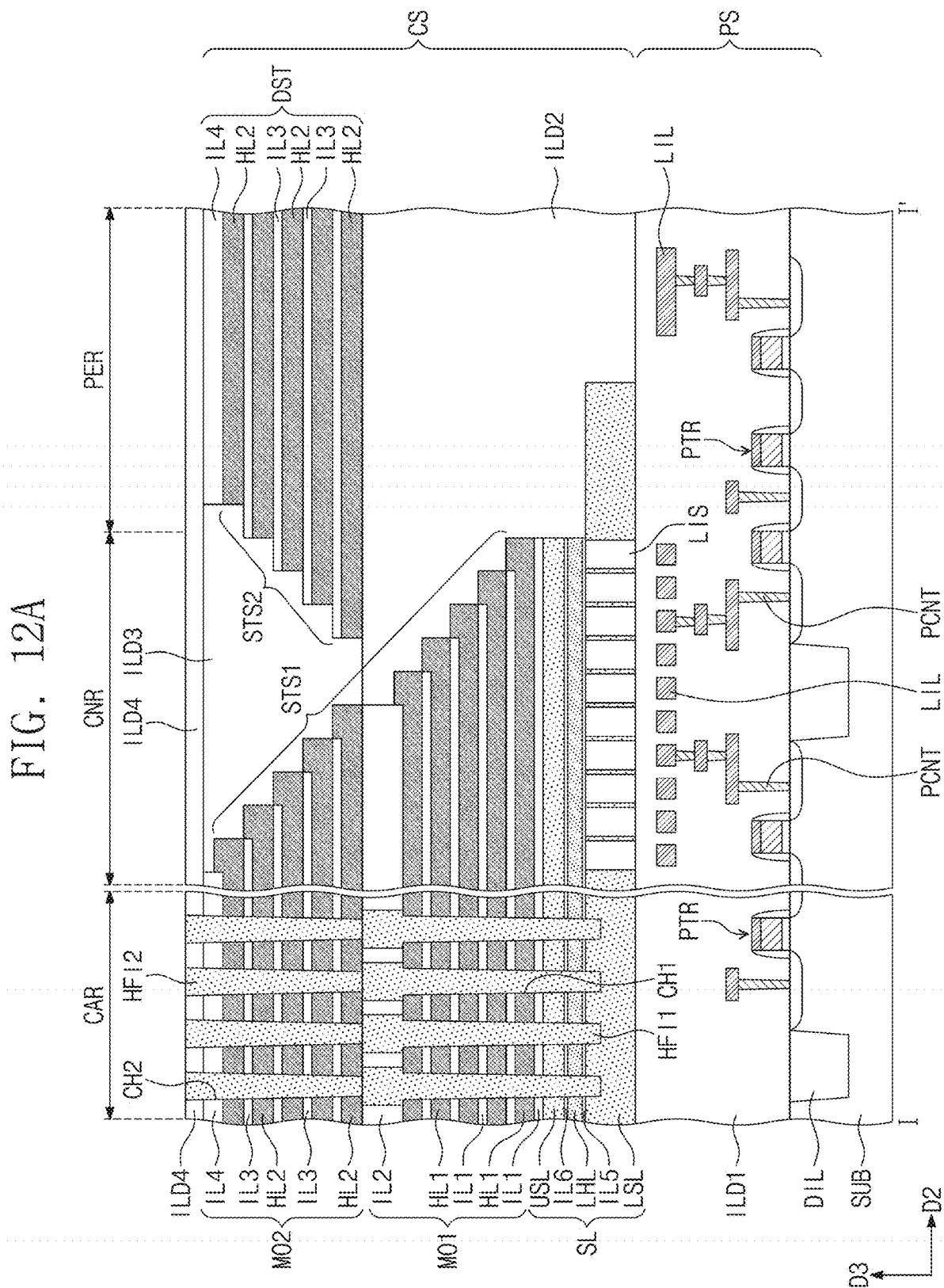
Figure 12B:
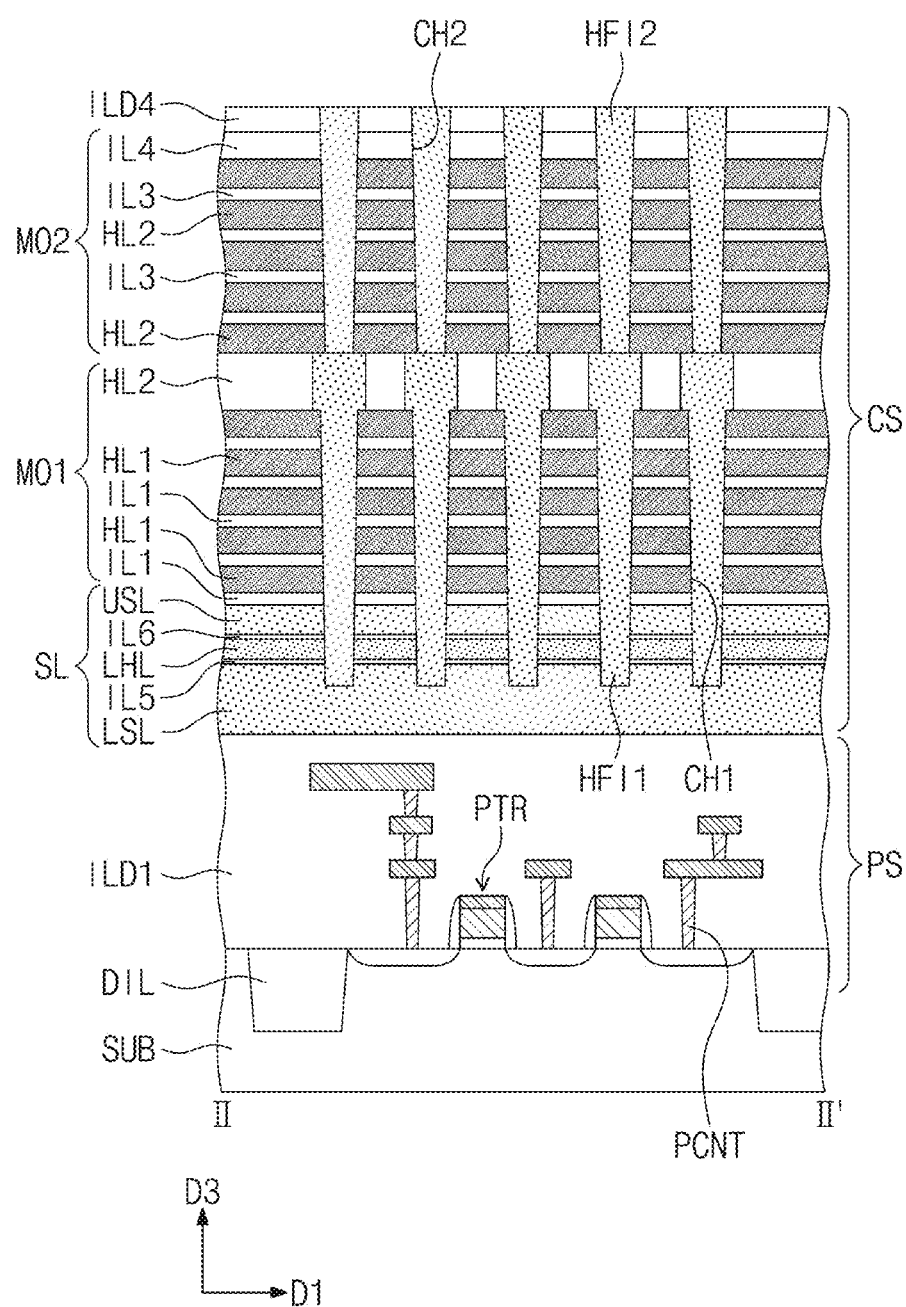

Referring to FIGS. 5, 12A and 12B, a fourth interlayer insulating layer ILD4 may be formed on an entire top surface of the first substrate SUB. Second channel holes CH2 may be formed to penetrate the second mold structure MO2 of the cell array region CAR. The second channel holes CH2 may vertically overlap with the first sacrificial pillars HFI1, respectively.

The formation of the second channel holes CH2 may use a photolithography process. For example, the formation of the second channel holes CH2 may include forming a photoresist pattern (and a mask pattern thereunder) having openings defining positions of the second channel holes CH2 by using the photolithography process, and performing an anisotropic etching process using the photoresist pattern and the mask pattern as etch masks. Other features of the process for forming the second channel holes CH2 may be substantially the same as those of the process for forming the first channel holes CH1 described above.

Second sacrificial pillars HFI2 may be formed to fill the second channel holes CH2, respectively. The second sacrificial pillars HFI2 may vertically overlap with the first sacrificial pillars HFI1, respectively. For example, the formation of the second sacrificial pillars HFI2 may include forming a second sacrificial mask layer filling the second channel holes CH2, and planarizing the second sacrificial mask layer until a top surface of the fourth interlayer insulating layer ILD4 is exposed. For example, the second sacrificial mask layer may include poly-silicon.

According to some example embodiments of the inventive concepts, after the planarization process, a level of a top surface of the fourth interlayer insulating layer ILD4 of the cell array region CAR may be substantially the same as a level of a top surface of the fourth interlayer insulating layer ILD4 of the dummy region PER. This may be because the dummy structure DST is provided at the same level as the second mold structure MO2 in the dummy region PER. The dummy structure DST may prevent (or reduce the likelihood of) the top surface of the fourth interlayer insulating layer ILD4 from being recessed in the planarization process. Thus, the dummy structure DST of the inventive concepts may prevent (or reduce the likelihood of) a step difference between the cell array region CAR and the dummy region PER from occurring at a top surface of the upper-level layer CS. As a result, according to some example embodiments of the inventive concepts, process defects may be reduced, and reliability of the semiconductor device may be improved.

The dummy structure DST according to some example embodiments of the inventive concepts may be adjacent and/or close to the first and second mold structures MO1 and MO2. In particular, at least a portion of the dummy structure DST may vertically overlap with the first mold structure MO1 in the overlapping region OVR. Thus, an area of the dummy region PER in which the dummy structure DST is disposed may be reduced, and a size of the semiconductor chip may be reduced. In other words, according to some example embodiments of the inventive concepts, an integration density of the semiconductor device may be improved.

Figure 13B:
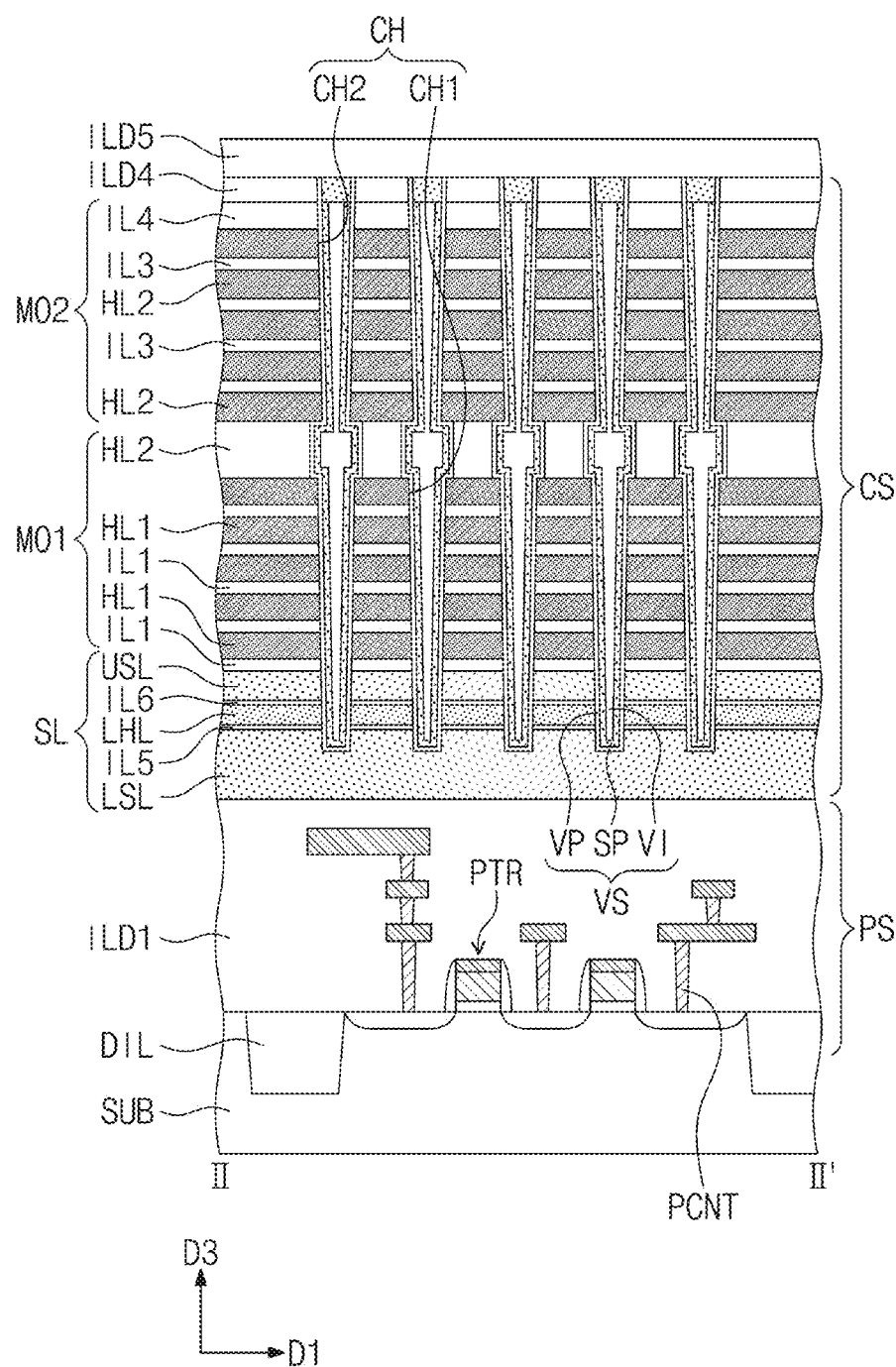

Referring to FIGS. 5, 13A and 13B, the first and second sacrificial pillars HFI1 and HFI2 filled in the first and second channel holes CH1 and CH2 may be selectively removed. The empty first and second channel holes CH1 and CH2 may be connected to each other to constitute a single channel hole CH.

Vertical channel structures VS may be formed in the channel holes CH, respectively. The formation of the vertical channel structure VS may include sequentially forming a vertical insulating pattern VP, a vertical semiconductor pattern SP and a filling insulation pattern VI on an inner surface of the channel hole CH. The vertical insulating pattern VP and the vertical semiconductor pattern SP may be conformally formed. A conductive pad PAD may be formed in an upper portion of each of the vertical channel structures VS. A fifth interlayer insulating layer ILD5 covering the conductive pads PAD may be formed on the fourth interlayer insulating layer ILD4.

Figure 14A:
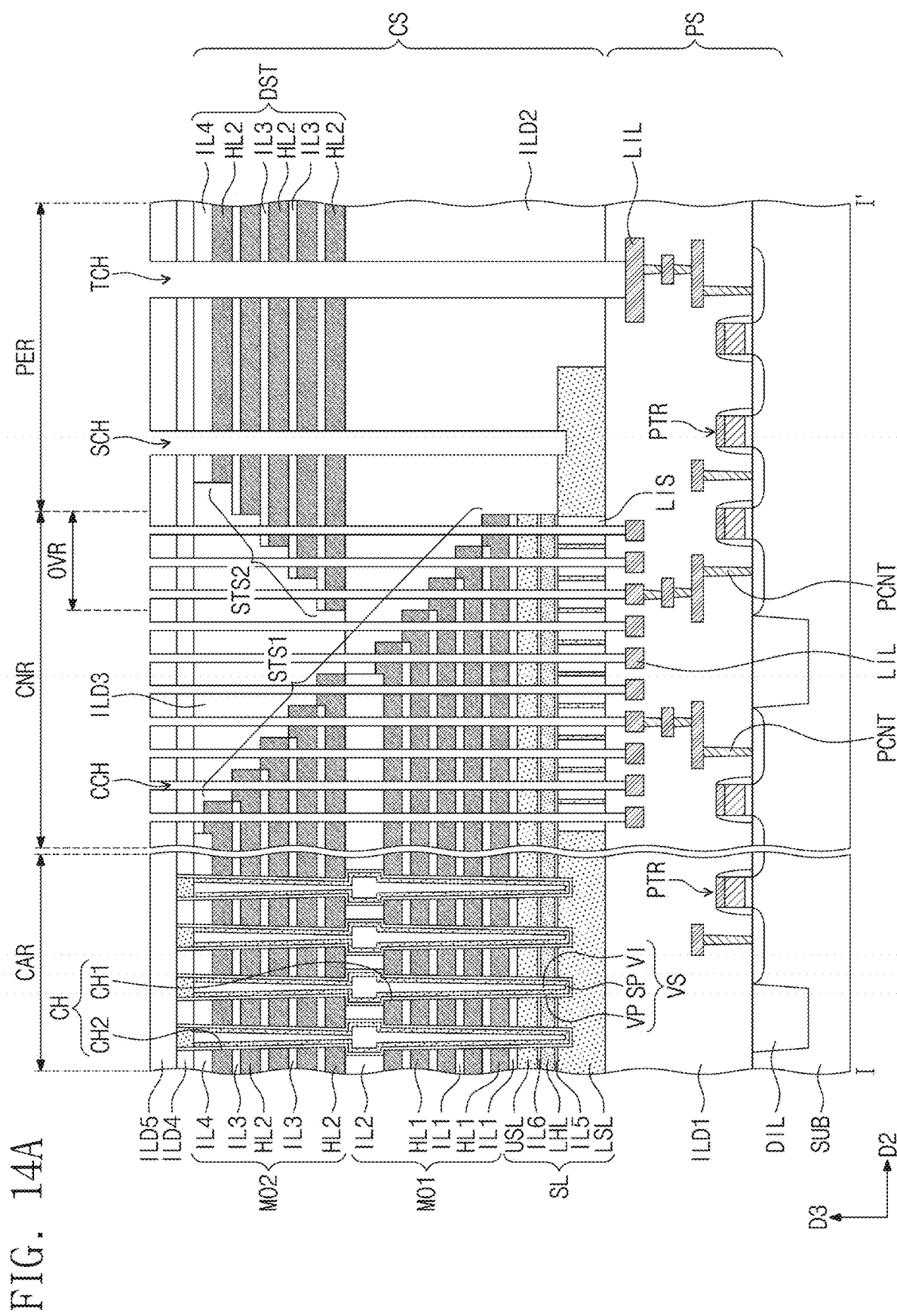
Figure 14B:
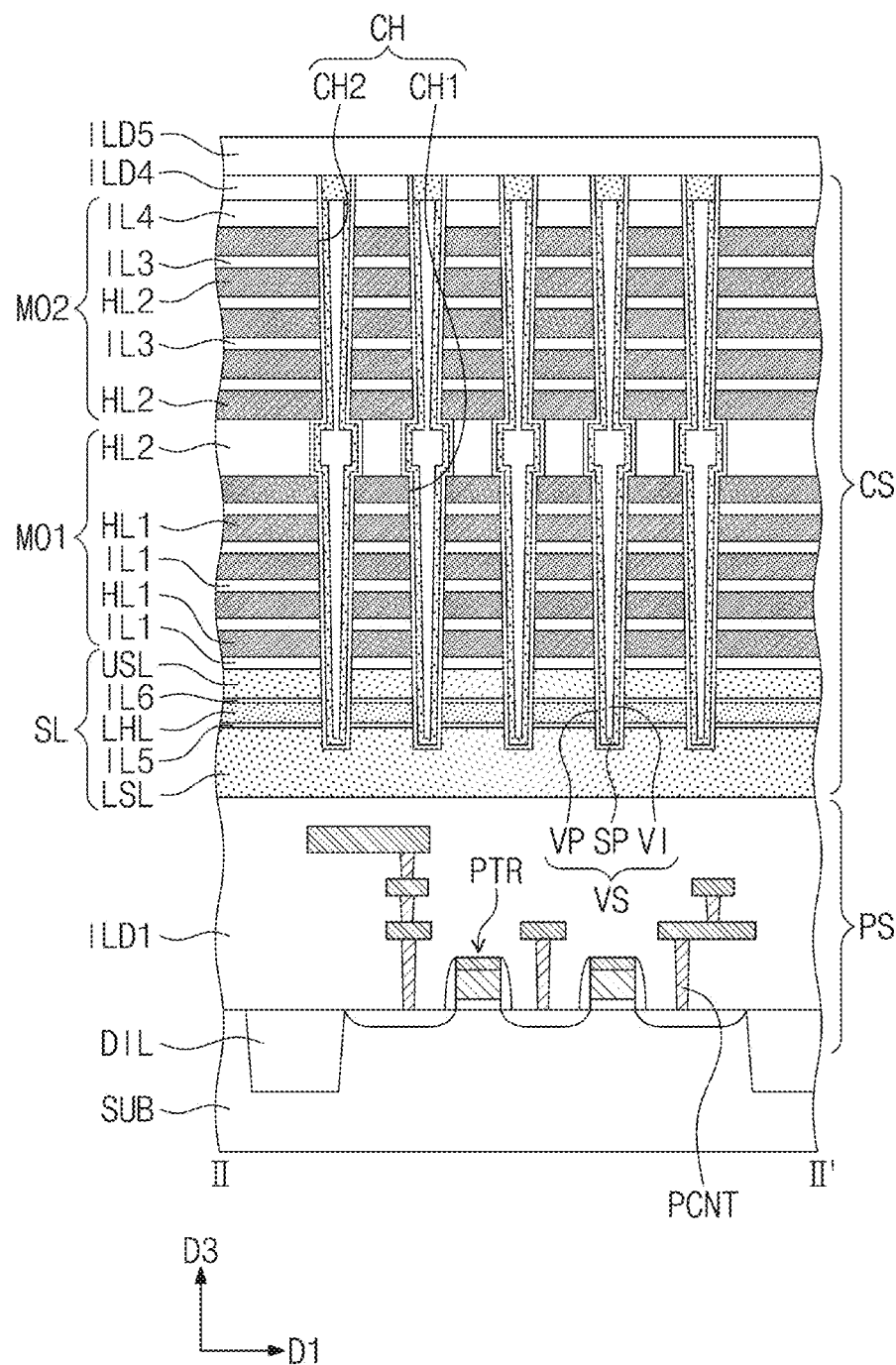

Referring to FIGS. 5, 14A and 14B, a patterning process may be performed on the fifth interlayer insulating layer ILD5 to form cell contact holes CCH and a through-contact hole TCH which penetrate the upper-level layer CS. A source contact hole SCH may be formed to penetrate the dummy structure DST. The source contact hole SCH may expose the lower semiconductor layer LSL. In some example embodiments, the cell contact holes CCH, the source contact hole SCH and the through-contact hole TCH may be formed at the same time by the same process.

The cell contact holes CCH may be formed in the cell contact region CNR. For example, a first cell contact hole of the cell contact holes CCH may penetrate the second mold structure MO2, the first mold structure MO1, the second substrate SL and the lower insulator LIS to expose the lower interconnection line LIL of the lower-level layer PS. A second cell contact hole of the cell contact holes CCH may penetrate the first mold structure MO1, the second substrate SL and the lower insulator LIS to expose the lower interconnection line LIL of the lower-level layer PS. A third cell contact hole, in the overlapping region OVR, of the cell contact holes CCH may penetrate the dummy structure DST, the first mold structure MO1, the second substrate SL and the lower insulator LIS to expose the lower interconnection line LIL of the lower-level layer PS.

The source contact hole SCH may be formed in the dummy region PER. The source contact hole SCH may penetrate the dummy structure DST to expose the lower semiconductor layer LSL. The through-contact hole TCH may be formed in the dummy region PER. The through-contact hole TCH may penetrate the dummy structure DST to expose the lower interconnection line LIL of the lower-level layer PS.

Figure 15A:
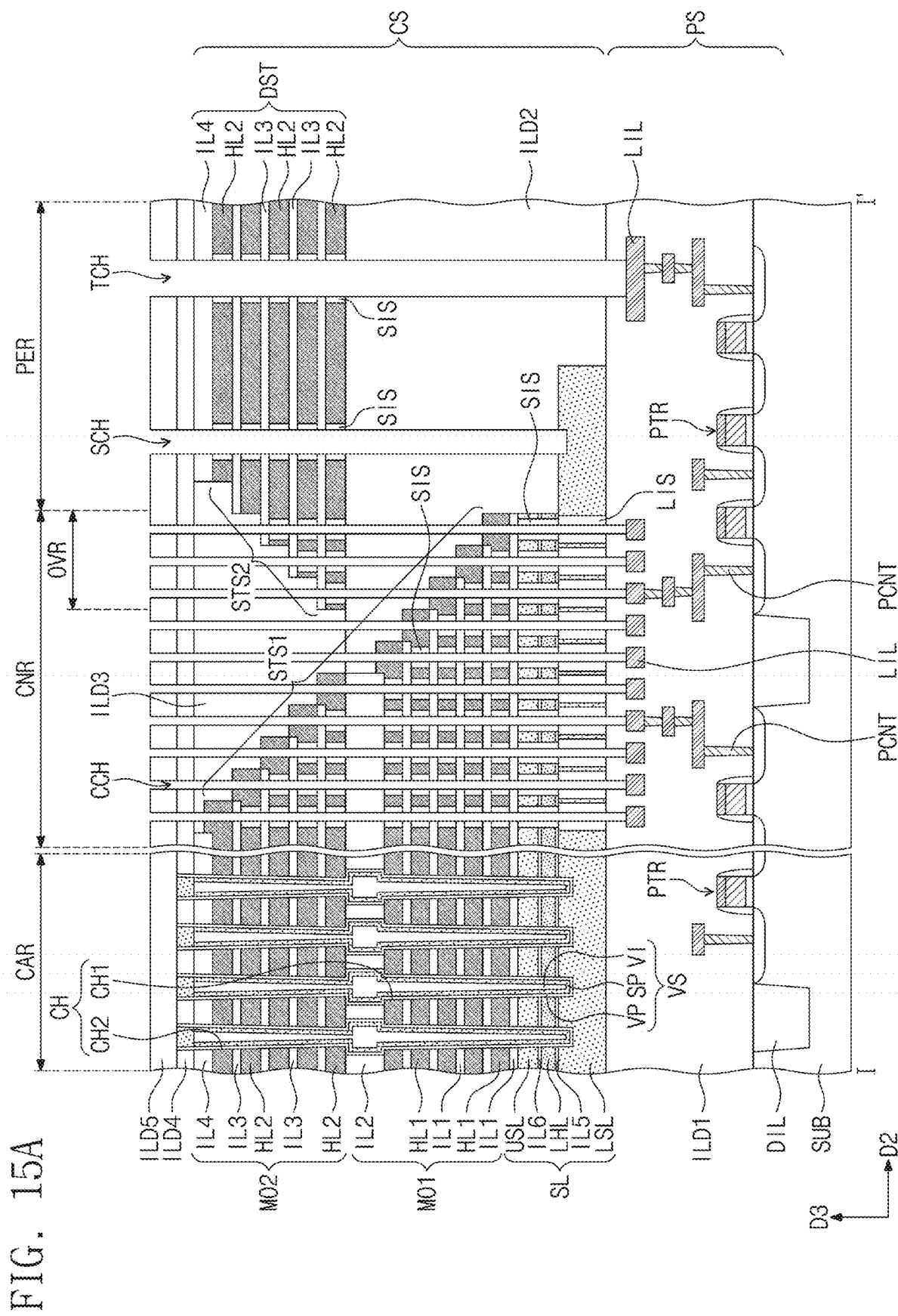
Figure 15B:
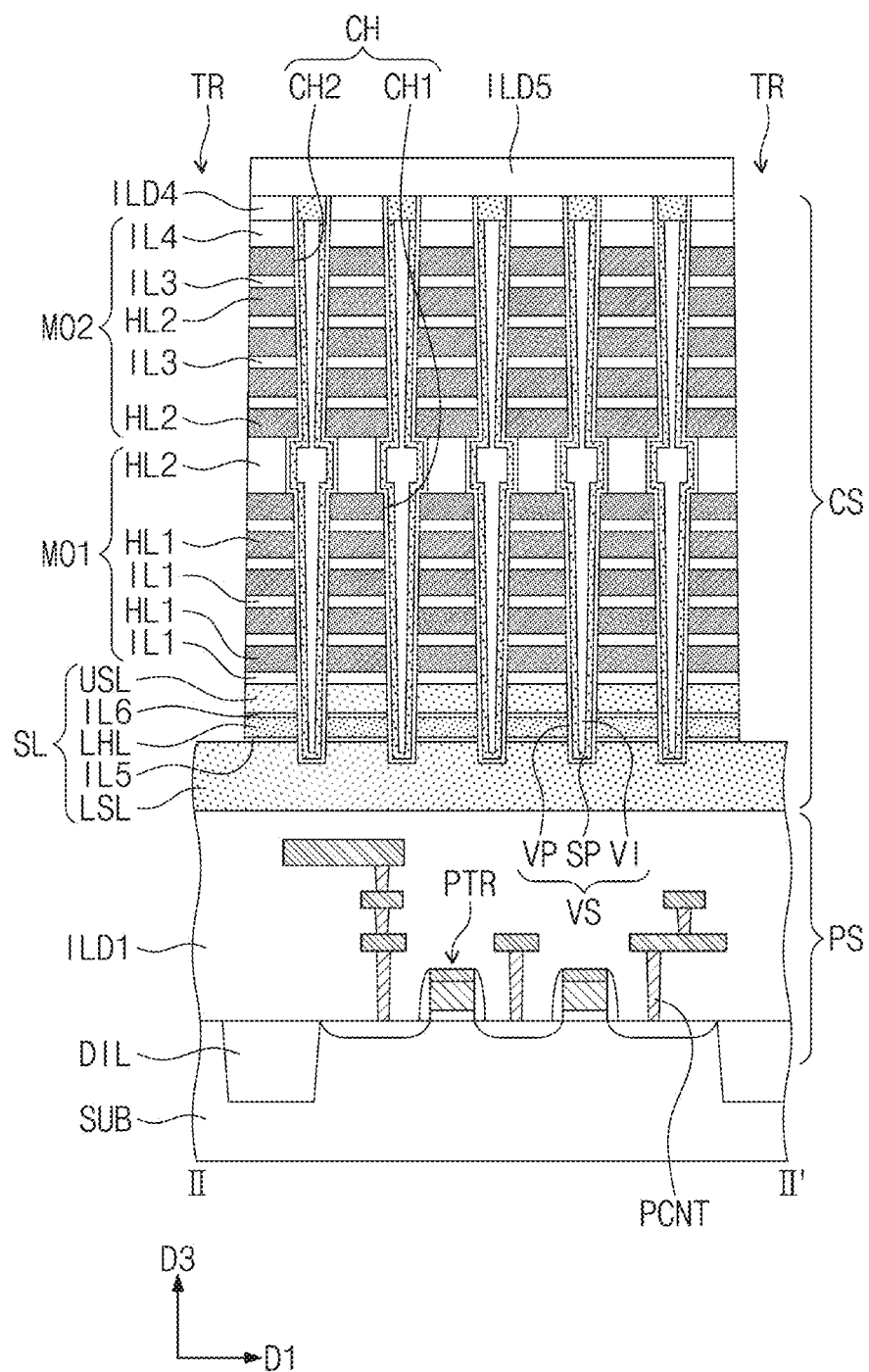

Referring to FIGS. 5, 15A and 15B, portions of the first and second sacrificial layers HL1 and HL2 exposed through the cell contact holes CCH, the source contact hole SCH and the through-contact hole TCH may be removed, and sidewall insulators SIS may be respectively formed in spaces formed by the removal of the portions. Meanwhile, the sidewall insulator SIS may not be formed on an uppermost sacrificial layer among the first and second sacrificial layers HL1 and HL2 which the cell contact hole CCH penetrates. For example, even though the sidewall insulator SIS is formed on the uppermost sacrificial layer, the sidewall insulator SIS may be removed, and a space formed by the removal of the sidewall insulator SIS may be filled with the same material as the sacrificial layer.

The first and second mold structures MO1 and MO2 of the cell array region CAR may be patterned to form trenches TR penetrating the first and second mold structures MO1 and MO2 (see FIG. 15B). The trench TR may expose the lower semiconductor layer LSL. The trench TR may also expose sidewalls of the first and second sacrificial layers HL1 and HL2. The trench TR may also expose a sidewall of the fifth insulating layer IL5, a sidewall of the lower sacrificial layer LHL, and a sidewall of the sixth insulating layer IL6.

Referring again to FIGS. 5, 6A and 6B, the lower sacrificial layer LHL exposed by the trenches TR in the cell array region CAR may be replaced with a source semiconductor layer SSL. In detail, the lower sacrificial layer LHL exposed by the trenches TR may be selectively removed. A lower portion of the vertical insulating pattern VP of each of the vertical channel structures VS may be exposed by the removal of the lower sacrificial layer LHL.

The exposed lower portion of the vertical insulating pattern VP may be selectively removed. Thus, a lower portion of the vertical semiconductor pattern SP may be exposed. The fifth insulating layer IL5 and the sixth insulating layer IL6 may be removed together during the removal of the lower portion of the vertical insulating pattern VP.

The source semiconductor layer SSL may be formed in a space formed by the removal of the fifth insulating layer IL5, the lower sacrificial layer LHL and the sixth insulating layer IL6. The source semiconductor layer SSL may be in direct contact with the exposed lower portion of the vertical semiconductor pattern SP. The source semiconductor layer SSL may be in direct contact with the lower semiconductor layer LSL thereunder. The source semiconductor layer SSL may be in direct contact with the upper semiconductor layer USL thereon. The lower semiconductor layer LSL, the source semiconductor layer SSL and the upper semiconductor layer USL in the cell array region CAR may constitute a second substrate SL.

The first and second sacrificial layers HL1 and HL2 exposed by the trenches TR in the cell array region CAR may be replaced with first and second electrodes EL1 and EL2, respectively, thereby forming a cell array structure ST. For example, the first and second sacrificial layers HL1 and HL2 exposed through the trenches TR may be selectively removed. The first and second electrodes EL1 and EL2 may be formed in spaces formed by the removal of the first and second sacrificial layers HL1 and HL2, respectively. Meanwhile, the second sacrificial layers HL2 of the dummy structure DST of the overlapping region OVR may also be replaced with second layers DEL (e.g., dummy electrodes) during the formation of the first and second electrodes EL1 and EL2. Subsequently, separation structures SPS may be formed to fill the trenches TR, respectively.

Cell contact plugs CPLG, a source contact plug SPLG and a through-via TVS may be formed by filling the cell contact holes CCH, the source contact hole SCH and the through-contact hole TCH with a metal, respectively. Each of the cell contact plugs CPLG may be connected to a corresponding one of the electrodes EL1 and EL2.

Bit line contact plugs BPLG may be formed to penetrate the fifth interlayer insulating layer ILD5. The bit line contact plugs BPLG may be connected to the conductive pads PAD, respectively. Bit lines BL connected to the bit line contact plugs BPLG may be formed on the fifth interlayer insulating layer ILD5. First upper interconnection lines UIL1 respectively connected to the cell contact plugs CPLG may be formed on the fifth interlayer insulating layer ILD5. A second upper interconnection line UIL2 and a third upper interconnection line UIL3 may be formed on the fifth interlayer insulating layer ILD5 and may be connected to the source contact plug SPLG and the through-via TVS, respectively.

Figure 16:
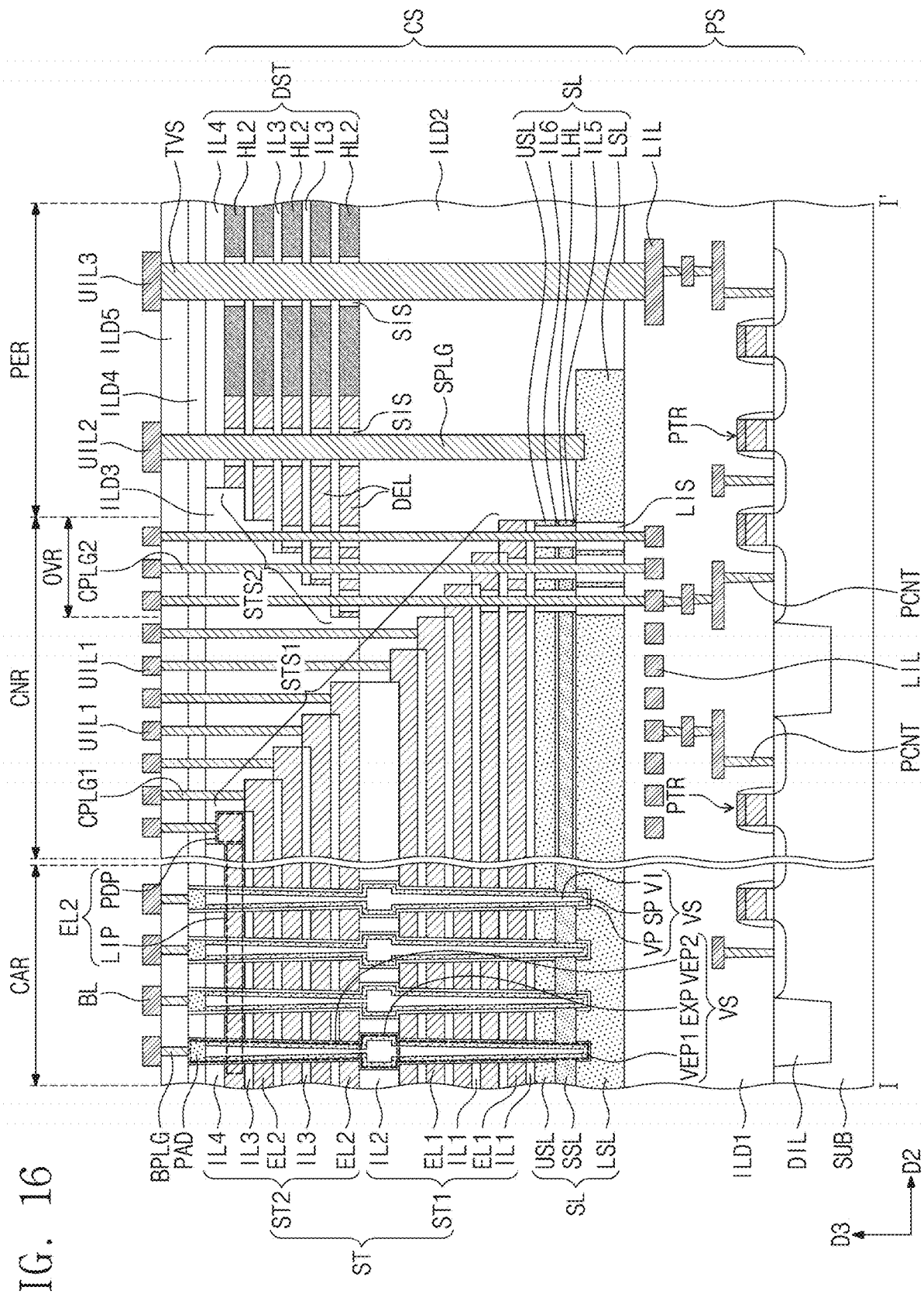
FIGS. 16, 17, and 18 are cross-sectional views taken along the line I-I' of FIG. 5 to illustrate semiconductor devices according to some example embodiments of the inventive concepts.
Figure 17:
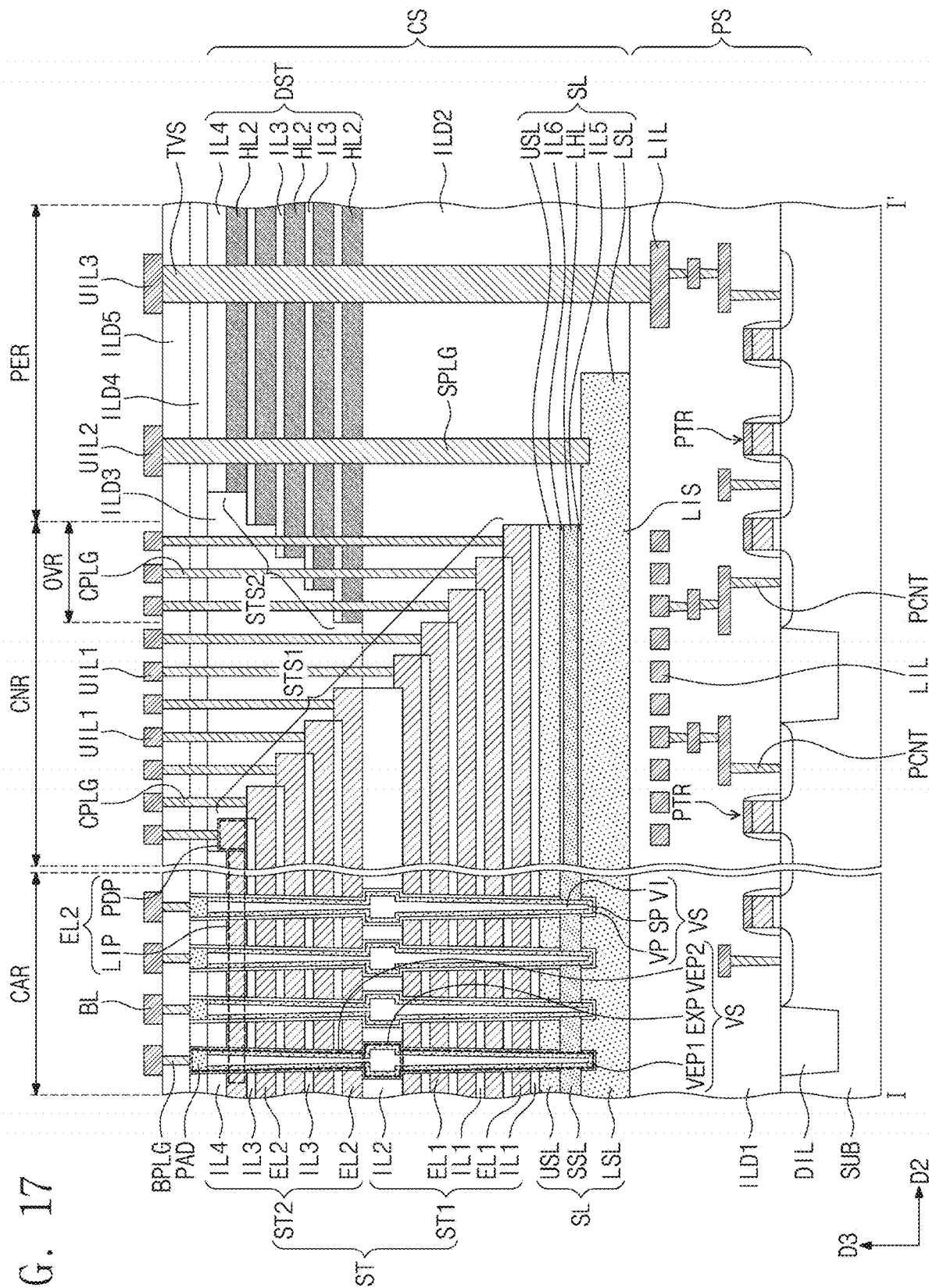
Figure 18:
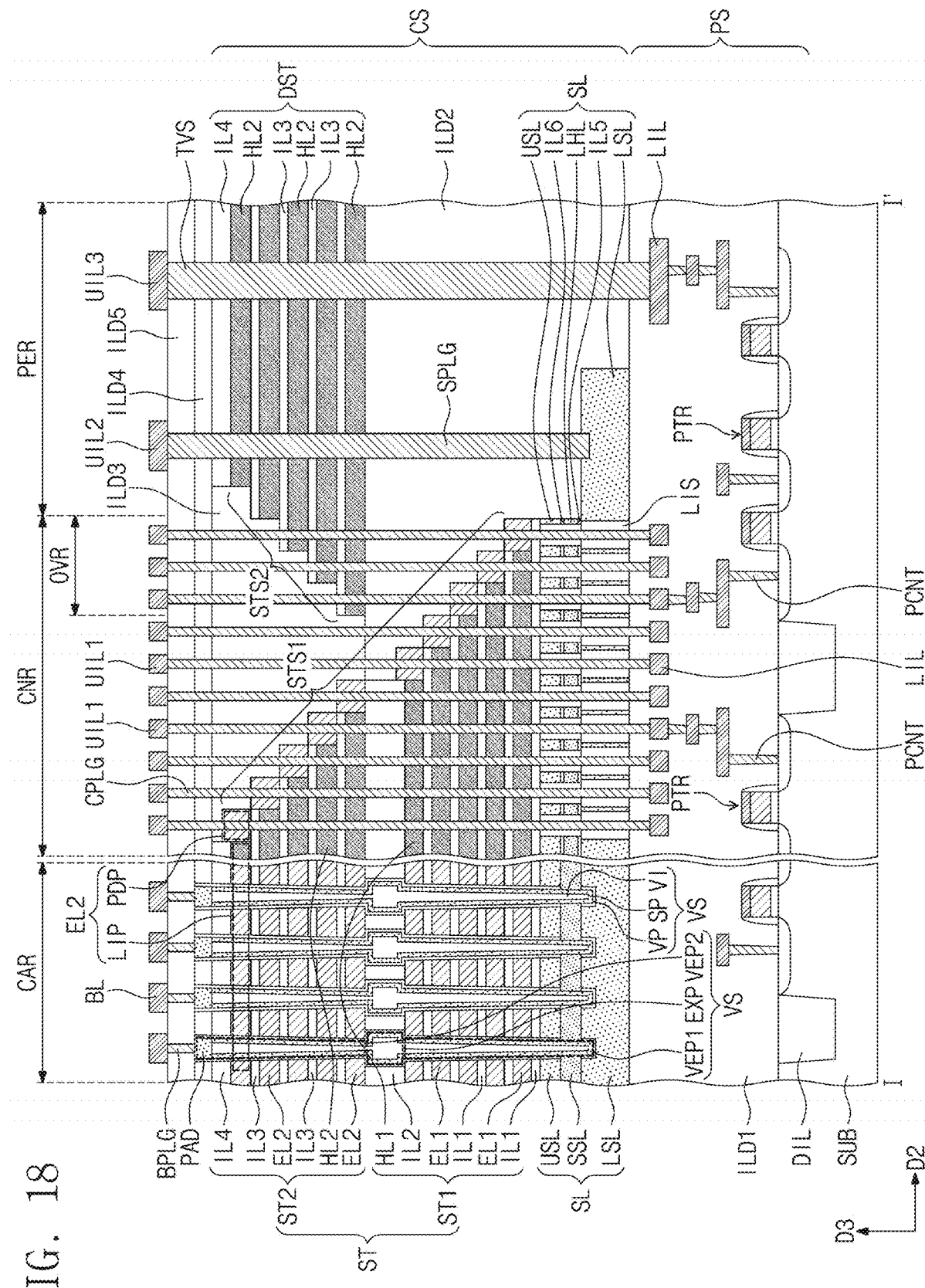

FIGS. 16 to 18 are cross-sectional views taken along the line I-I' of FIG. 5 to illustrate semiconductor devices according to some example embodiments of the inventive concepts. In some of the example embodiments of FIGS. 16 to 18, the descriptions to the same components and technical features as in the example embodiments of FIGS. 5, 6A and 6B will be omitted for the purpose of ease and convenience in explanation. In other words, differences between the example embodiments of FIGS. 16 to 18 and the example embodiments of FIGS. 5, 6A and 6B will be mainly described hereinafter.

Referring to FIGS. 5 and 16, cell contact plugs CPLG may include first cell contact plugs CPLG1 provided in the cell contact region CNR, and second cell contact plugs CPLG2 provided in the overlapping region OVR.

Each of the first cell contact plugs CPLG1 may be connected to the pad portion PDP of a corresponding one of the electrodes EL1 and EL2. The first cell contact plugs CPLG1 may not penetrate the cell array structure ST. Each of the first cell contact plugs CPLG1 may connect the corresponding electrode EL1 or EL2 to a corresponding one of the first upper interconnection lines UIL1.

The second cell contact plugs CPLG2 may penetrate the dummy structure DST and the first stack structure ST1 overlapping with the dummy structure DST. The second cell contact plug CPLG2 may be selectively connected to a corresponding one of the first electrodes EL1 by using the sidewall insulator SIS. The second cell contact plug CPLG2 may directly connect the first electrode EL1 connected thereto to a corresponding one of the lower interconnection lines LIL of the lower-level layer PS.

Referring to FIGS. 5 and 17, cell contact plugs CPLG may not penetrate the cell array structure ST. Each of the cell contact plugs CPLG may be connected to the pad portion PDP of a corresponding one of the electrodes EL1 and EL2.

A dummy structure DST may not include the second layers DEL. The cell contact plugs CPLG in the overlapping region OVR may penetrate the dummy structure DST so as to be connected to corresponding ones of the first electrodes EL1 of the first stack structure ST1, respectively.

In some example embodiments, the sidewall insulators SIS may be omitted. The dummy structure DST of some example embodiments may not include the second layers DEL formed of the conductive material but may include only the insulating materials HL2, IL3 and IL4. Thus, the cell contact plugs CPLG in the overlapping region OVR may penetrate the dummy structure DST without the sidewall insulators SIS.

Referring to FIGS. 5 and 18, each of first electrodes EL1 of the cell contact region CNR may include the first sacrificial layer HL1. A conductive material (e.g., a metal) may be selectively provided in a pad portion PDP of the first electrode EL1, and the first sacrificial layer HL1 formed of an insulating material may be provided in a line portion LIP of the first electrode EL1.

Each of second electrodes EL2 of the cell contact region CNR may include the second sacrificial layer HL2. A conductive material (e.g., a metal) may be selectively provided in a pad portion PDP of the second electrode EL2, and the second sacrificial layer HL2 formed of an insulating material may be provided in a line portion LIP of the second electrode EL2.

A dummy structure DST may not include the second layers DEL. In other words, the dummy structure DST of some example embodiments may not include the second layers DEL formed of the conductive material but may include only the insulating materials HL2, IL3 and IL4.

The cell contact plugs CPLG may penetrate the cell array structure ST. The cell contact plugs CPLG in the overlapping region OVR may penetrate both the dummy structure DST and the cell array structure ST. In some example embodiments, the sidewall insulators SIS in the cell array structure ST and the dummy structure DST may be omitted.

According to some example embodiments of the inventive concepts, due to the dummy structure in the dummy region, it is possible to prevent (or reduce) occurrence of a step difference in the top surface of the upper-level layer between the cell array region and the dummy region. Thus, process defects of the semiconductor device may be reduced, and the reliability of the semiconductor device may be improved.

The dummy structure according to some example embodiments of the inventive concepts may vertically overlap with the staircase structure of the cell array structure in the overlapping region. Thus, an area of the dummy region in which the dummy structure is disposed may be reduced, and a size of the semiconductor chip may be reduced. In other words, the integration density of the semiconductor device according to the inventive concepts may be improved.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
an upper-level layer on a substrate, the upper-level layer having a cell array region, a dummy region, and a cell contact region between the cell array region and the dummy region,
wherein the upper-level layer includes
a semiconductor layer;
a cell array structure on the semiconductor layer of the cell array region, the cell array structure including a first stack structure on the semiconductor layer and a second stack structure on the first stack structure, each of the first and second stack structures including a plurality of electrodes stacked and spaced apart from each other;
a first staircase structure on the semiconductor layer of the cell contact region, the plurality of electrodes extending from the cell array structure into the first staircase structure such that the cell array structure and the first staircase structure are connected to each other;
a vertical channel structure penetrating the cell array structure so as to be connected to the semiconductor layer;
a dummy structure in the dummy region, the dummy structure at the same level as the second stack structure, and the dummy structure including a plurality of first layers stacked and spaced apart from each other; and
cell contact plugs in the cell contact region and connected to the first staircase structure,
the cell contact region includes an overlapping region adjacent to the dummy region, and
the dummy structure vertically overlaps with at least a portion of the first staircase structure in the overlapping region.

2. The semiconductor device of claim 1, wherein each of the plurality of electrodes includes
a pad portion constituting the first staircase structure; and
a line portion extending from the cell array region to the pad portion,
wherein each of the cell contact plugs is connected to the pad portion.

3. The semiconductor device of claim 1, wherein the dummy structure includes a second staircase structure extending from the dummy region into the overlapping region.

4. The semiconductor device of claim 3, wherein the second staircase structure of the dummy structure is horizontally offset from the first staircase structure at the same level as the second staircase structure.

5. The semiconductor device of claim 1, wherein
the dummy structure further includes second layers in the overlapping region,
each of the second layers is at the same level as a corresponding one of the first layers,
the first layers include a different material from that of the second layers,
the cell contact plugs include a first cell contact plug in the overlapping region,
the first cell contact plug penetrates the dummy structure so as to be connected to the first staircase structure, and
the upper-level layer further includes a first sidewall insulator between the first cell contact plug and the second layer which the first cell contact plug penetrates.

6. The semiconductor device of claim 5, wherein
the cell contact plugs include a second cell contact plug in the cell contact region,
the second cell contact plug penetrates corresponding electrodes of the electrodes of the first staircase structure,
the second cell contact plug is connected to an uppermost electrode of the corresponding electrodes, and
the upper-level layer further includes second sidewall insulators between the second cell contact plug and the other electrodes of the corresponding electrodes.

7. The semiconductor device of claim 1, further comprising
a lower-level layer including a peripheral circuit between the substrate and the upper-level layer.

8. The semiconductor device of claim 7, wherein
the lower-level layer includes a lower interconnection line under the semiconductor layer,
at least one cell contact plug of the cell contact plugs penetrates the first staircase structure and the semiconductor layer so as to be connected to the lower interconnection line, and
the at least one cell contact plug vertically connects the electrode connected thereto to the lower interconnection line connected thereto.

9. The semiconductor device of claim 7, wherein the upper-level layer further comprises
an upper interconnection line on the dummy structure; and
a through-via penetrating the dummy structure,
wherein
the lower-level layer includes a lower interconnection line, and
the through-via vertically extends from the upper interconnection line to the lower interconnection line to vertically connect the upper interconnection line to the lower interconnection line.

10. The semiconductor device of claim 1, wherein the vertical channel structure includes
a vertical semiconductor pattern connected to the semiconductor layer; and
a vertical insulating pattern between the vertical semiconductor pattern and the electrodes,
wherein the vertical insulating pattern includes a charge storage layer.

11. A semiconductor device comprising:
an upper-level layer on a substrate, the upper-level layer having a cell array region, a dummy region, and a cell contact region between the cell array region and the dummy region,
wherein the upper-level layer includes
a semiconductor layer;
a cell array structure on the semiconductor layer of the cell array region, the cell array structure including a first stack structure on the semiconductor layer and a second stack structure on the first stack structure, each of the first and second stack structures includes a plurality of electrodes stacked and spaced apart from each other;
a staircase structure on the semiconductor layer of the cell contact region, the plurality of electrodes extending from the cell array structure into the staircase structure such that the cell array structure and the staircase structure are connected to each other;
a vertical channel structure penetrating the cell array structure so as to be connected to the semiconductor layer;

a dummy structure in the dummy region, the dummy structure at the same level as the second stack structure, and the dummy structure including a plurality of first layers stacked and spaced apart from each other; and cell contact plugs in the cell contact region and connected to the staircase structure, the cell contact region includes an overlapping region adjacent to the dummy region, the cell contact plugs include a first cell contact plug in the overlapping region, and the first cell contact plug penetrates the dummy structure so as to be connected to the staircase structure.

12. The semiconductor device of claim 11, further comprising a lower-level layer including a peripheral circuit between the substrate and the upper-level layer, wherein the lower-level layer includes a lower interconnection line under the semiconductor layer, the first cell contact plug further penetrates the staircase structure and the semiconductor layer so as to be connected to the lower interconnection line, and the first cell contact plug vertically connects the electrode connected thereto to the lower interconnection line connected thereto.

13. The semiconductor device of claim 11, wherein
the dummy structure further includes second layers in the overlapping region, each of the second layers is at the same level as a corresponding one of the first layers, and the upper-level layer further includes a sidewall insulator between the first cell contact plug and the second layer which the first cell contact plug penetrates.

14. The semiconductor device of claim 11, wherein
the cell contact plugs include a second cell contact plug in the cell contact region, the second cell contact plug penetrates corresponding electrodes of the electrodes of the staircase structure, the second cell contact plug is connected to an uppermost electrode of the corresponding electrodes, and the upper-level layer further includes sidewall insulators between the second cell contact plug and the other electrodes of the corresponding electrodes.

15. The semiconductor device of claim 11, wherein the dummy structure vertically overlaps with the staircase structure in the overlapping region.

16. An electronic system comprising:
a semiconductor device including an input/output pad electrically connected to peripheral circuits; and a controller electrically connected to the semiconductor device through the input/output pad and configured to control the semiconductor device, wherein the semiconductor device includes a lower-level layer including the peripheral circuits on a substrate; and an upper-level layer on the lower-level layer, the upper-level layer having a cell array region, a dummy region, and a cell contact region between the cell array region and the dummy region, the upper-level layer includes a semiconductor layer;

a cell array structure on the semiconductor layer of the cell array region, the cell array structure including a first stack structure on the semiconductor layer and a second stack structure on the first stack structure, each of the first and second stack structures including a plurality of electrodes stacked and spaced apart from each other;

a vertical channel structure penetrating the cell array structure so as to be connected to the semiconductor layer;

a first staircase structure on the semiconductor layer of the cell contact region, the plurality of electrodes extending from the cell array structure into the first staircase structure such that the cell array structure and the first staircase structure are connected to each other;

a dummy structure in the dummy region, the dummy structure at the same level as the second stack structure, the dummy structure comprising a plurality of first layers stacked and spaced apart from each other, and the dummy structure including a second staircase structure extending from the dummy region into the cell contact region; and cell contact plugs in the cell contact region and connected to the first staircase structure, the cell contact region includes an overlapping region adjacent to the dummy region, and the second staircase structure of the dummy structure vertically overlaps with at least a portion of the first staircase structure in the overlapping region.

17. The electronic system of claim 16, wherein the second staircase structure of the dummy structure is horizontally offset from the first staircase structure at the same level as the second staircase structure.

18. The electronic system of claim 16, wherein
the dummy structure further includes second layers in the overlapping region, the second layers constitute the second staircase structure, the first layers include a different material from that of the second layers, the cell contact plugs include a first cell contact plug in the overlapping region, the first cell contact plug penetrates the second staircase structure so as to be connected to the first staircase structure, and the upper-level layer further includes a first sidewall insulator between the first cell contact plug and the second layer which the first cell contact plug penetrates.

19. The electronic system of claim 18, wherein
the cell contact plugs include a second cell contact plug in the cell contact region, the second cell contact plug penetrates corresponding electrodes of the electrodes of the first staircase structure, wherein the second cell contact plug is connected to an uppermost electrode of the corresponding electrodes, and wherein the upper-level layer further includes second sidewall insulators between the second cell contact plug and the other electrodes of the corresponding electrodes.

20. The electronic system of claim 16, wherein
the upper-level layer further includes
an upper interconnection line on the dummy structure; and a through-via penetrating the dummy structure,
the lower-level layer includes a lower interconnection line, and the through-via vertically extends from the upper interconnection line to the lower interconnection line to vertically connect the upper interconnection line to the lower interconnection line.

* * * * *